(12) United States Patent
Yamazaki et al.

(10) Patent No.: US 8,310,399 B2
(45) Date of Patent: *Nov. 13, 2012

(54) WIRELESS CHIP

(75) Inventors: Shunpei Yamazaki, Setagaya (JP);
Konami Izumi, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/371,675

(22) Filed: Feb. 13, 2012

(65) Prior Publication Data

US 2012/0139017 A1  Jun. 7, 2012

Related U.S. Application Data

(63) Continuation of application No. 12/981,574, filed on Dec. 30, 2010, now Pat. No. 8,120,538, and a continuation of application No. 11/918,627, filed as application No. PCT/JP2006/309127 on Apr. 25, 2006, now Pat. No. 7,864,115.

(30) Foreign Application Priority Data

Apr. 27, 2005   (JP) ................................. 2005-129326

(51) Int. Cl.
*H01Q 1/38* (2006.01)

(52) U.S. Cl. .................................. 343/700 MS; 343/846

(58) Field of Classification Search ........... 343/700 MS, 343/846, 848, 702
See application file for complete search history.

(56) References Cited

U.S. PATENT DOCUMENTS

| | | | |
|---|---|---|---|
| 5,019,829 | A | 5/1991 | Heckman et al. |
| 5,932,302 | A | 8/1999 | Yamazaki et al. |
| 6,097,622 | A | 8/2000 | Shimizu et al. |
| 6,171,674 | B1 | 1/2001 | Yamazaki et al. |
| 6,183,816 | B1 | 2/2001 | Yamazaki et al. |
| 6,320,546 | B1 | 11/2001 | Newton et al. |

(Continued)

FOREIGN PATENT DOCUMENTS

EP             1 432 022 A      6/2004

(Continued)

OTHER PUBLICATIONS

International Search Report (Application No. PCT/JP2006/309127) dated Aug. 15, 2006.

(Continued)

*Primary Examiner* — Hoanganh Le
(74) *Attorney, Agent, or Firm* — Eric J. Robinson; Robinson Intellectual Property Law Office, P.C.

(57) ABSTRACT

The invention provides a wireless chip which can secure the safety of consumers while being small in size, favorable in communication property, and inexpensive, and the invention also provides an application thereof. Further, the invention provides a wireless chip which can be recycled after being used for managing the manufacture, circulation, and retail. A wireless chip includes a layer including a semiconductor element, and an antenna. The antenna includes a first conductive layer, a second conductive layer, and a dielectric layer sandwiched between the first conductive layer and the second conductive layer, and has a spherical shape, an ovoid shape, an oval spherical shape like a go stone, an oval spherical shape like a rugby ball, or a disc shape, or has a cylindrical shape or a polygonal prism shape in which an outer edge portion thereof has a curved surface.

17 Claims, 23 Drawing Sheets

U.S. PATENT DOCUMENTS

| | | | |
|---|---|---|---|
| 6,344,824 B1 | 2/2002 | Takasugi et al. | |
| 6,392,602 B2 | 5/2002 | Kawahata et al. | |
| 6,468,617 B1 | 10/2002 | Yamazaki et al. | |
| 6,486,853 B2 | 11/2002 | Yoshinomoto et al. | |
| 6,559,802 B2 | 5/2003 | Goto et al. | |
| 6,631,847 B1 | 10/2003 | Kasahara et al. | |
| 6,792,021 B1 | 9/2004 | Suzuki | |
| 6,835,523 B1 | 12/2004 | Yamazaki et al. | |
| 6,862,003 B2 | 3/2005 | Yoshinomoto et al. | |
| 6,897,815 B2 | 5/2005 | Goto et al. | |
| 7,026,994 B2 | 4/2006 | Ikuta et al. | |
| 7,056,810 B2 | 6/2006 | Yamazaki et al. | |
| 7,132,984 B2 | 11/2006 | Kameda et al. | |
| 7,271,076 B2 | 9/2007 | Yamazaki et al. | |
| 7,298,330 B2 | 11/2007 | Forster et al. | |
| 7,365,686 B2 | 4/2008 | Sakama et al. | |
| 7,372,426 B2 | 5/2008 | Fukuda | |
| 7,459,726 B2 | 12/2008 | Kato et al. | |
| 7,482,248 B2 | 1/2009 | Tamura | |
| 7,652,359 B2 | 1/2010 | Takayama et al. | |
| 7,700,164 B2 | 4/2010 | Yamazaki et al. | |
| 7,863,116 B2 | 1/2011 | Takayama et al. | |
| 7,864,115 B2 * | 1/2011 | Yamazaki et al. | ..... 343/700 MS |
| 7,915,739 B2 | 3/2011 | Michalk et al. | |
| 8,120,538 B2 * | 2/2012 | Yamazaki et al. | ..... 343/700 MS |
| 2004/0152276 A1 | 8/2004 | Nishimura | |
| 2004/0169786 A1 | 9/2004 | Yamazaki et al. | |
| 2006/0055014 A1 | 3/2006 | Tsurume et al. | |
| 2006/0202269 A1 | 9/2006 | Suzuki et al. | |
| 2006/0220211 A1 | 10/2006 | Yamazaki et al. | |
| 2008/0111756 A1 | 5/2008 | Ochi et al. | |

FOREIGN PATENT DOCUMENTS

| | | |
|---|---|---|
| EP | 1 437 695 A | 7/2004 |
| EP | 1 439 410 A | 7/2004 |
| EP | 1 548 872 A | 6/2005 |
| JP | 62-015903 | 1/1987 |
| JP | 03-060203 | 3/1991 |
| JP | 09-083239 | 3/1997 |
| JP | 10-270609 A | 10/1998 |
| JP | 10-303640 | 11/1998 |
| JP | 10-313207 | 11/1998 |
| JP | 2000-149270 A | 5/2000 |
| JP | 2000-155827 A | 6/2000 |
| JP | 2000-357339 A | 12/2000 |
| JP | 2001-298315 | 10/2001 |
| JP | 2001-339239 | 12/2001 |
| JP | 2002-217627 | 8/2002 |
| JP | 2002-271118 | 9/2002 |
| JP | 2002-325014 | 11/2002 |
| JP | 2002-344146 | 11/2002 |
| JP | 2004-006897 | 1/2004 |
| JP | 2004-040597 A | 2/2004 |
| JP | 2004-111856 A | 4/2004 |
| JP | 2004-194211 | 7/2004 |
| JP | 2004-208202 | 7/2004 |
| JP | 2004-208203 A | 7/2004 |
| JP | 2004-214635 A | 7/2004 |
| JP | 2004-220587 A | 8/2004 |
| JP | 2004-221284 A | 8/2004 |
| JP | 2004-240412 A | 8/2004 |
| JP | 2004-247405 A | 9/2004 |
| JP | 2004-274259 A | 9/2004 |
| JP | 2004-297374 | 10/2004 |
| JP | 2005-004779 A | 1/2005 |
| JP | 2005-068529 A | 3/2005 |

OTHER PUBLICATIONS

Written Opinion (Application No. PCT/JP2006/309127) dated Aug. 15, 2006.

Usami et al., "17.1: An SOI-Based 7.5μm-Thick 0.15×0.15mm$^2$ RFID Chip," ISSCC 2006 (Digest of Technical Papers. IEEE International Solid-State Circuits Conference), Feb. 6, 2006, pp. 308-309/ 655.

* cited by examiner

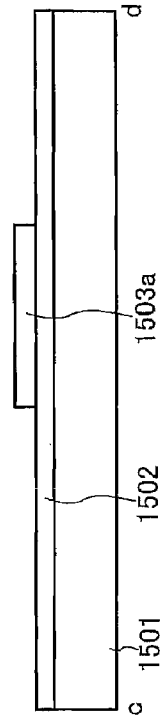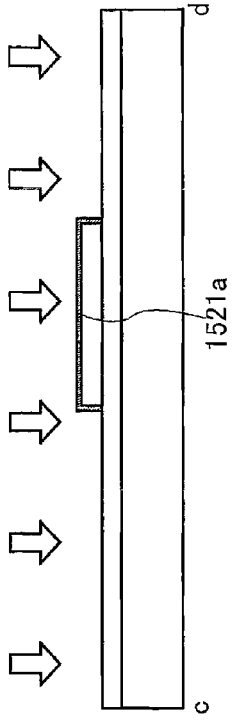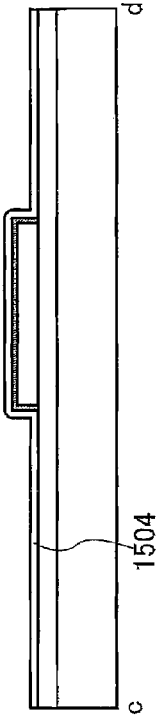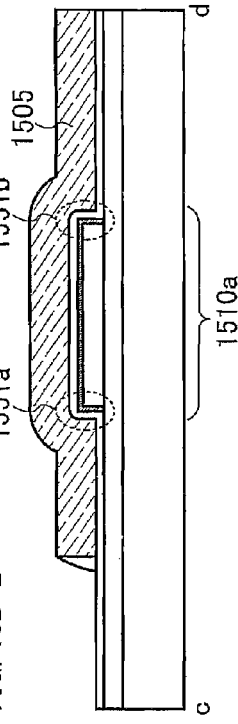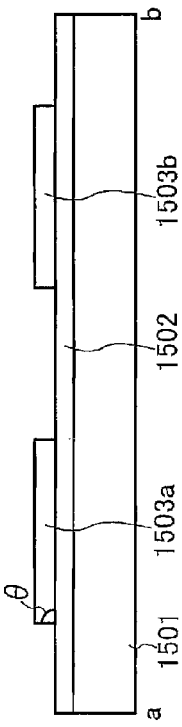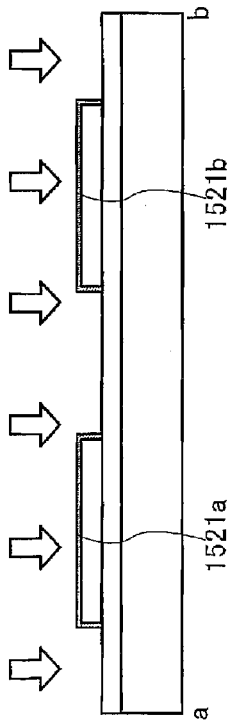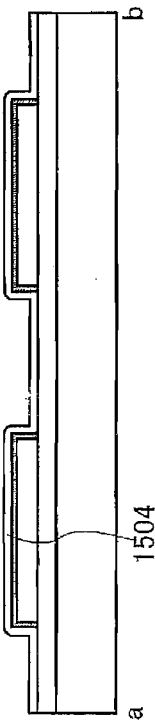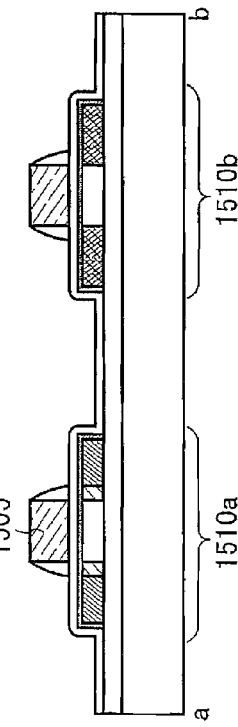

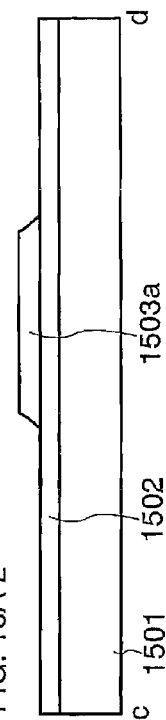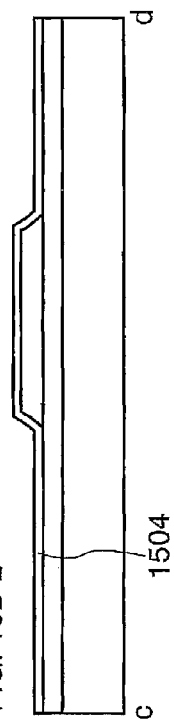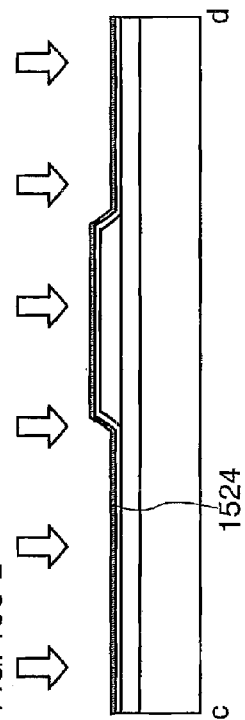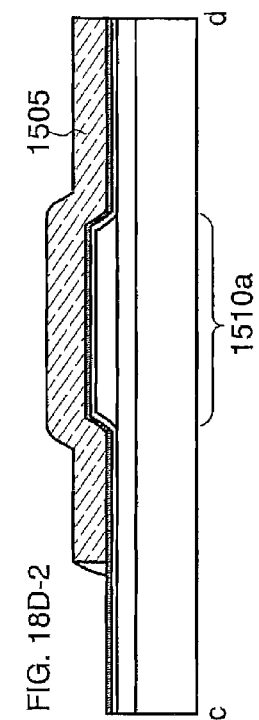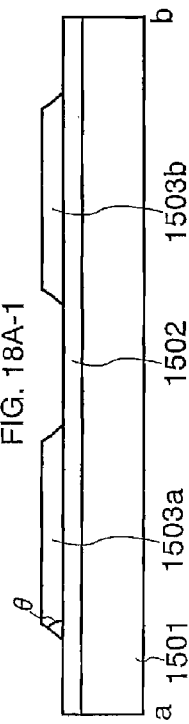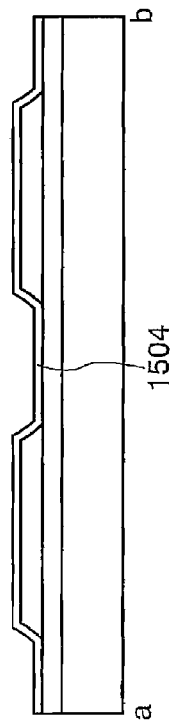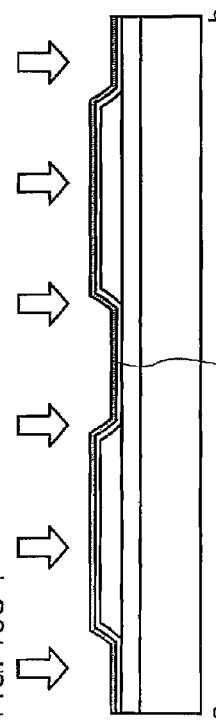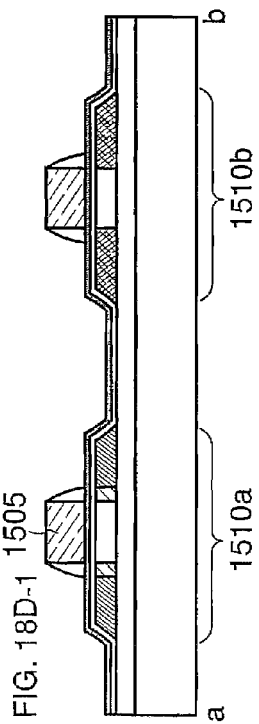

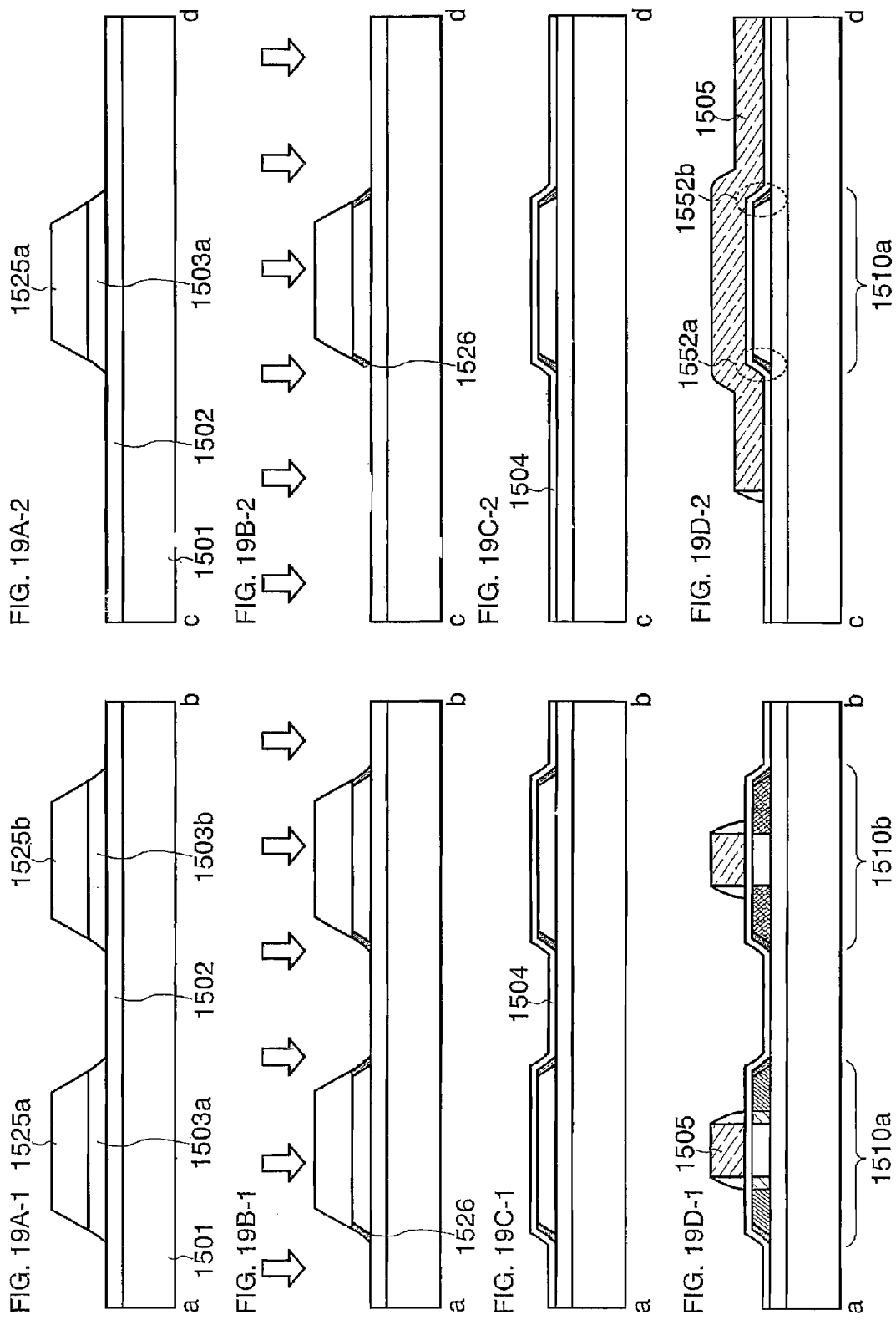

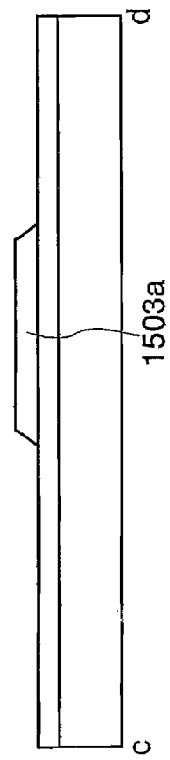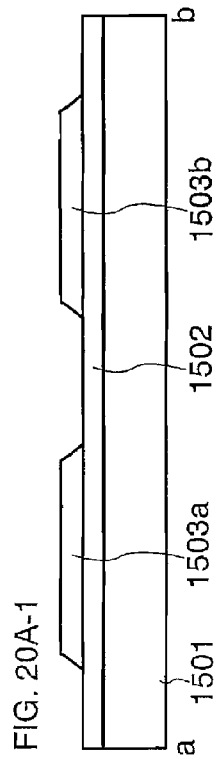
FIG. 20A-1
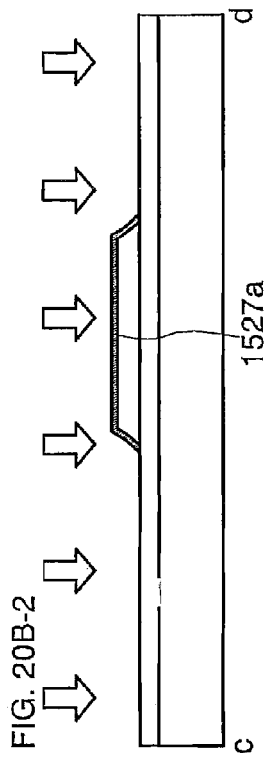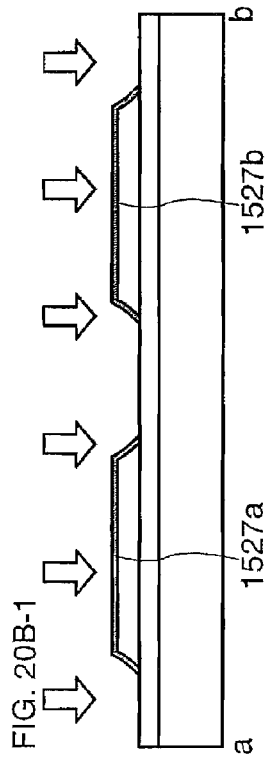
FIG. 20B-1
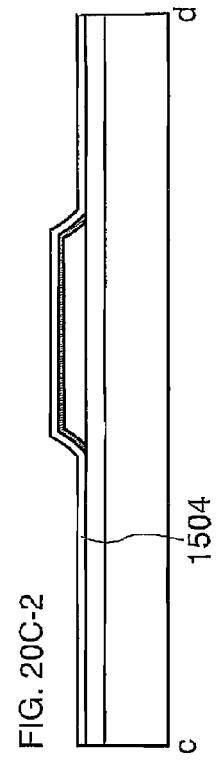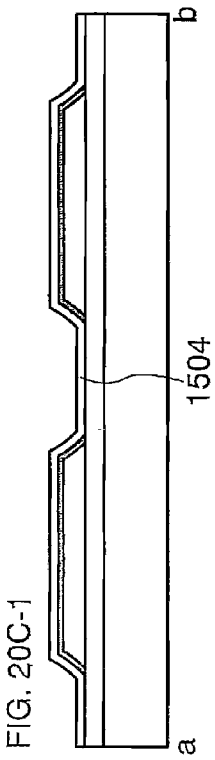
FIG. 20C-1
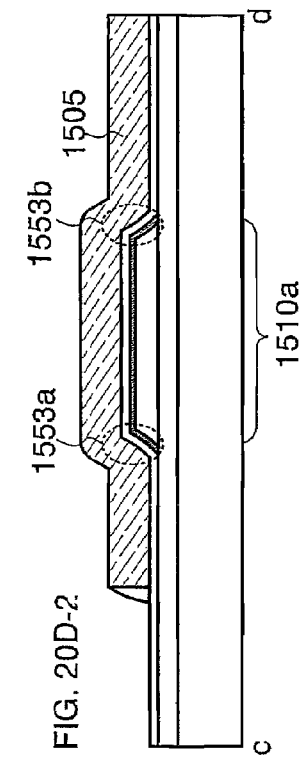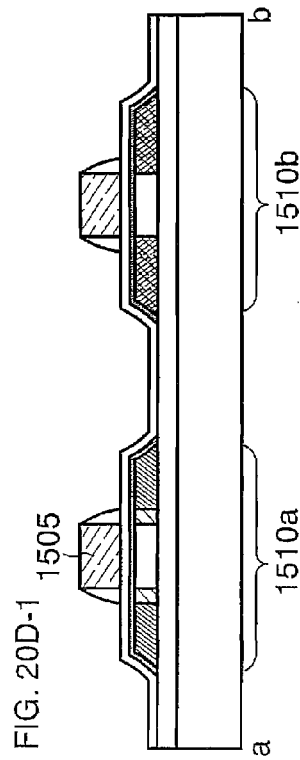
FIG. 20D-1
FIG. 20A-2
FIG. 20B-2
FIG. 20C-2
FIG. 20D-2

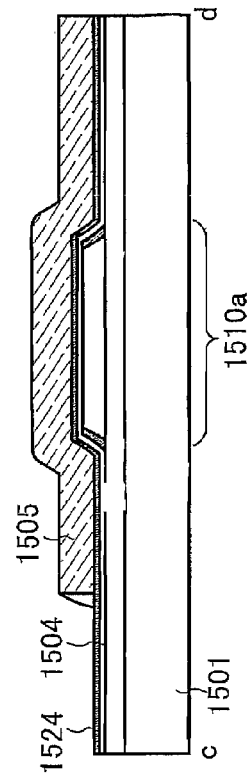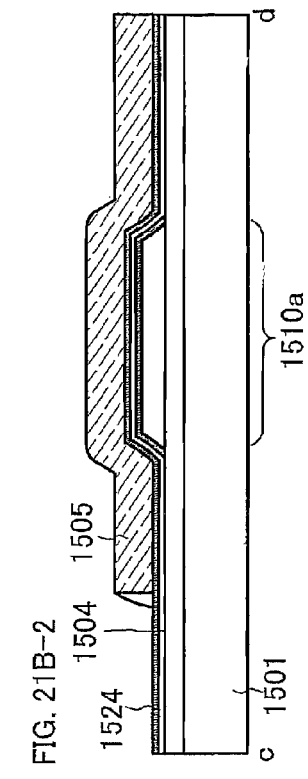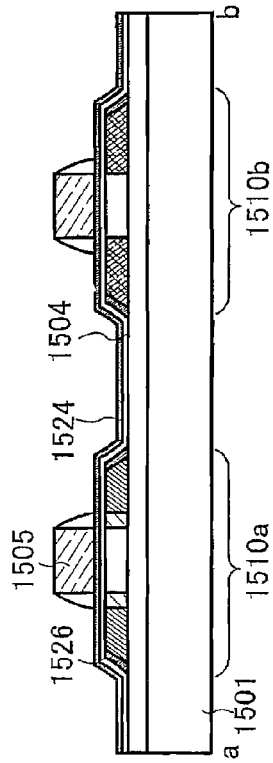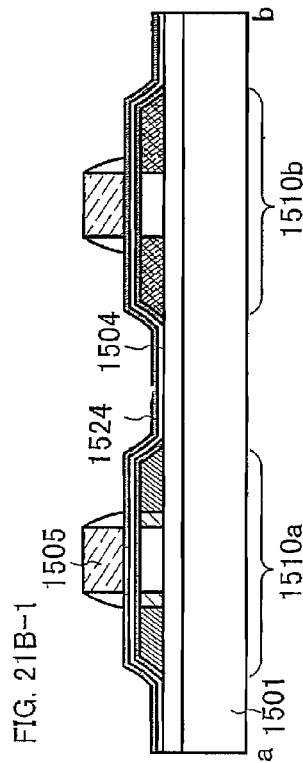

WIRELESS CHIP

TECHNICAL FIELD

The invention relates to a wireless chip which communicates wirelessly through electromagnetic waves.

BACKGROUND ART

In recent years, an automatic recognition technique which is constituted by a wireless chip which stores data in its electronic circuit, a reader/writer which reads and writes data stored in the wireless chip, and a host system which processes the read data, controls the reader/writer, or the like has been developed and introduced (see FIGS. 2A and 2B). A wireless chip 201 is called by various names such as an RFID tag, an IC tag, and a wireless tag, however, as a specific name does not exist, it is called a wireless chip in this specification. The wireless chip 201 basically has no battery and performs a dielectric operation by electromagnetic waves emitted from the reader/writer 202 to wirelessly communicate with the reader/writer 202. Moreover, a computer 203 is generally used as a host system which communicates with the reader/writer 202 through a serial port, an USB (Universal Serial Bus) port 204, or the like. This automatic recognition technique is expected to be capable of totally managing the manufacture, circulation, and retail of objects. Therefore, a wireless chip which is inexpensive, favorable in communication property, and small in size has been developed.

As an example, Patent Document 1 discloses a stacked-layer electronic component which is small in size and superior in electronic characteristics by using a plurality of two or more kinds of resin substrates which have different dielectric constants and permeability.

Japanese Patent Document Laid-open No. 2004-6897

DISCLOSURE OF INVENTION

Other than the electronic components disclosed as examples in the aforementioned patent document, a small and inexpensive wireless chip has been developed and an automatic recognition technique using the wireless chip has been introduced into the market. When these techniques are used for the manufacture, circulation, and retail of objects, the wireless chip ultimately reaches a consumer. The ultimate consumers are general public including people who have no knowledge about the wireless chip and the automatic recognition technique. Therefore, for example, there is a risk of an unexpected accident such as injuring skin or drinking by mistake. Moreover, there is a problem in the disposal method and recycling since a large number of wireless chips are used when used for retail.

The invention provides a wireless chip which is small in size, favorable in communication property, and inexpensive and which can ensure the safety of the ultimate consumer, and an application thereof. Furthermore, the invention provides a wireless chip which can be recycled after being used for managing the manufacture, circulation, and retail.

In order to solve the aforementioned objects, the invention provides the following means.

A wireless chip of the invention includes an antenna and a layer including a semiconductor element electrically connected to the antenna. The antenna includes a first conductive layer, a second conductive layer, and a dielectric layer sandwiched between the first conductive layer and the, second conductive layer. The dielectric layer has a spherical shape, an ovoid shape, an oval spherical shape like a go stone, an oval spherical shape like a rugby ball, a disc shape, or has a cylindrical shape or a polygonal prism shape in which an outer edge portion of the cylindrical shape or the polygonal prism shape has a curved surface.

In the aforementioned wireless chip, the antenna and the layer including a semiconductor element are electrically connected through a resin layer containing conductive particles.

A wireless chip of the invention includes a layer including a semiconductor element, a layer including a passive element electrically connected to the layer including the semiconductor element, and an antenna electrically connected to the layer including the passive element. The antenna includes a first conductive layer, a second conductive layer, and a dielectric layer sandwiched between the first conductive layer and the second conductive layer. The dielectric layer has a spherical shape, an ovoid shape, an oval spherical shape like a go stone, an oval spherical shape like a rugby ball, a disc shape, or has a cylindrical shape or a polygonal prism shape in which an outer edge portion thereof has a curved surface.

In the aforementioned wireless chip, the layer including a passive element includes a passive element formed of at least one of an inductor, a capacitor, and a resistor. The layer including a passive element and the semiconductor element are electrically connected through a resin layer containing conductive particles.

Further, an antenna included in the wireless chip of the invention includes a first conductive layer which functions as an emitter electrode, a second conductive layer which functions as a ground, and a dielectric layer sandwiched between the first conductive layer and the second conductive layer.

Further, a layer including a semiconductor element in the wireless chip of the invention is formed over a semiconductor substrate or an insulating substrate. The insulating substrate may be a flexible substrate. Further, a semiconductor element formed over an insulating substrate has an inorganic semiconductor layer or an organic semiconductor layer. The thickness of the layer including a semiconductor element is preferably 1 to 5 μm.

Further, a wireless chip of the invention includes a high frequency circuit.

In a wireless chip of the invention, a dielectric layer which forms an antenna is formed of one or a plurality selected from alumina, glass, forsterite, barium titanate, lead titanate, strontium titanate, lead zirconate, lithium niobate, and lead zirconate titanate. Further, the dielectric layer can also be formed of one or a plurality selected from an epoxy resin, a phenol resin, a poly butadiene resin, a BT resin, vinyl benzyl, and polyfumarate.

Coated with a resin or DLC, a wireless chip of the invention has a spherical shape, an ovoid shape, an oval spherical shape like a go stone, an oval spherical shape like a rugby ball, a disc shape, or has a cylindrical shape or a polygonal prism shape in which an outer edge surface thereof has a curved surface.

The invention can provide a wireless chip which is small in size, favorable in communication property, and inexpensive by forming an antenna using a dielectric with a high dielectric constant or a magnetic body.

Further, the invention can provide a wireless chip with high safety which does not cause an injury or the like when touched, by forming an outer shape of a dielectric layer which forms the outer shape of the wireless chip so as to have only a flat surface and a curved surface.

The invention can provide a wireless chip with high safety which does not harm a human body even when the wireless chip is drunk by mistake, by coating the outermost surface with a resin or DLC (Diamond-Like Carbon) so as to have a shape with a curved surface. Moreover, the physical strength of the wireless chip is enhanced by coating the outermost surface thereof, which leads to a recyclable wireless chip which can be used repeatedly.

Furthermore, in the case of attaching a wireless tag to a product, a wireless tag may be wrapped with paper, plastic, cloth, or the like or incorporated in a bag, a box, a free gift, or the like. Accordingly, the wireless chip can be safely used by forming the outermost surface thereof with a material and a shape with high safety and a size and a shape that the consumers can easily recognize the wireless tag.

BRIEF DESCRIPTION OF DRAWINGS

FIGS. 16A to 16D are sectional views showing manufacturing steps of semiconductor elements which form a wireless chip.

FIGS. 18A to 18D are sectional views showing manufacturing steps of semiconductor elements which form a wireless chip.

FIGS. 19A to 19D are sectional views showing manufacturing steps of semiconductor elements which form a wireless chip.

FIGS. 20A to 20D are sectional views showing manufacturing steps of semiconductor elements which form a wireless chip.

FIGS. 21A and 21B are sectional views showing manufacturing steps of semiconductor elements which form a wireless chip.

BEST MODE FOR CARRYING OUT THE INVENTION

Embodiment Mode

Figure 1A:
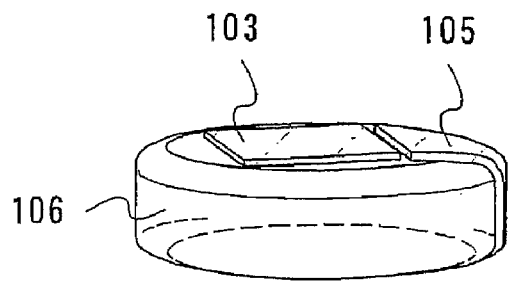
FIGS. 1A is a perpendicular view and 1B is a sectional view of a wireless chip of the invention.

Although the invention will be fully described by way of embodiment modes and embodiments with reference to the accompanying drawings, it is to be understood that various changes and modifications will be apparent to those skilled in the art. Therefore, unless such changes and modifications depart from the scope of the invention, they should be construed as being included therein. Note that identical portions in embodiment modes are denoted by the same reference numerals in different drawings.

[Embodiment Mode 1]

Figure 2A:
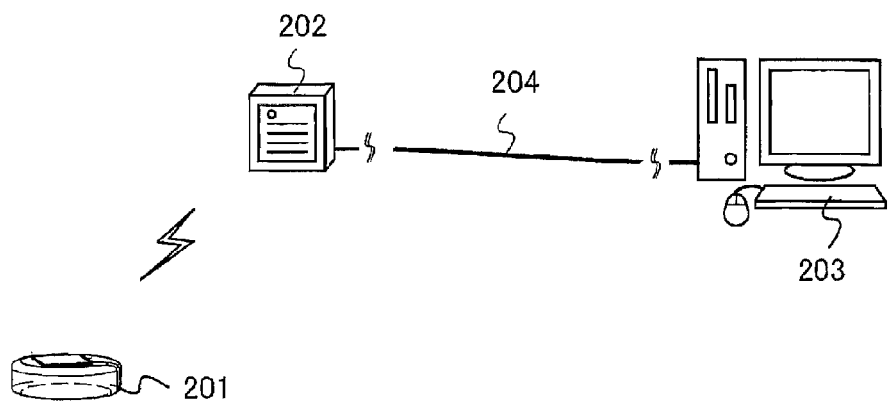
FIGS. 2A and 2B are block diagrams showing circuit configurations of a wireless chip of the invention.

As shown in FIG. 2A, the wireless chip 201 of the invention wirelessly communicates with the reader/writer 202. The wireless chip 201 generally operates by receiving power supply from the reader/writer 202 through electromagnetic waves for communication. Receiving the data transmitted from the reader/writer 202, the wireless chip 201 determines right or wrong thereof and sends back the stored data to the reader/write 202 when the data is right. Furthermore, the wireless chip 201 stores and erases the data based on the instruction received from the reader/writer 202.

Figure 1B:
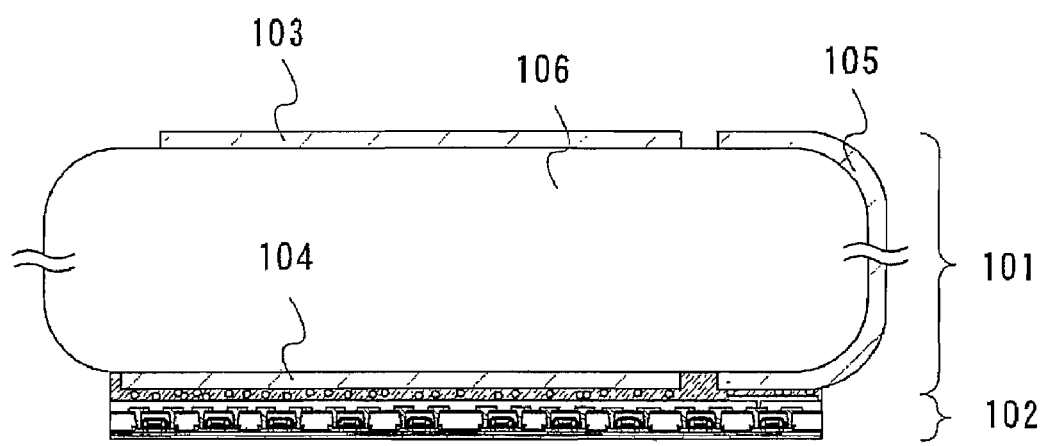

FIGS. 1A and 1B show a wireless chip of the invention with the aforementioned configuration. FIG 1A is a perspective view showing an example of an appearance of the wireless chip and FIG. 1B is a sectional view of the wireless chip.

Figure 23A:
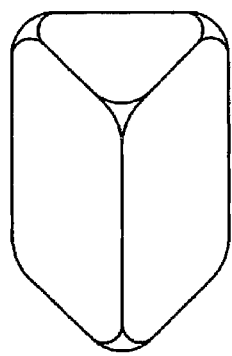
FIGS. 23A to 23G are diagrams showing shapes of an antenna which forms a wireless chip.
Figure 23B:
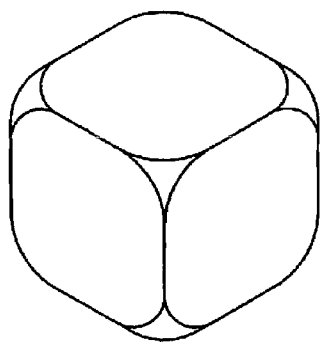
Figure 23C:
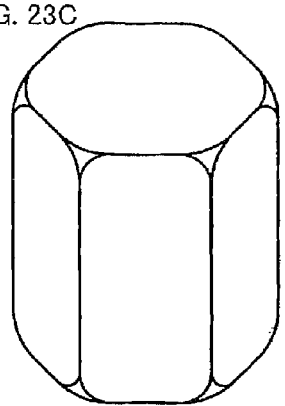
Figure 23D:
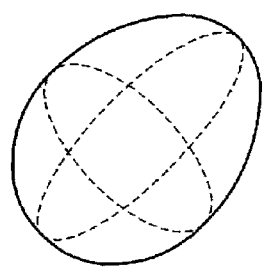
Figure 23E:
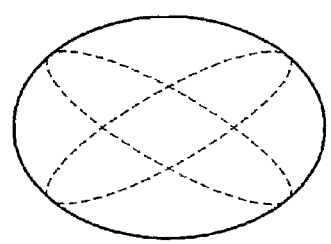
Figure 23F:
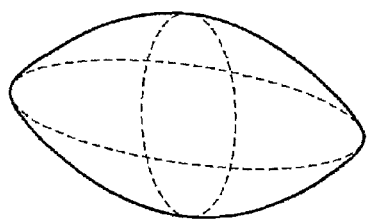
Figure 23G:
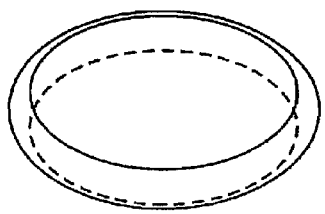

As shown in FIG. 1A as an example, the wireless chip of the invention has a cylindrical shape and a curved surface in an outer edge portion. In specific, corners at which a top surface, a bottom surface, and a side surface of the cylindrical shape intersect are rounded off by grinding or the like, thereby a shape having only a flat surface and a curved surface is obtained. Besides, a shape with no corner may be obtained by forming a polygonal prism shape such as a quadratic prism and rounding off corners at which a top surface, a bottom surface, and a side surface intersect and corners at which a side surface and another side surface intersect as shown in FIGS. 23A to 23C. Furthermore, a spherical shape, an ovoid shape (FIG. 23D), an oval spherical shape like a go stone (FIG. 23E), an oval spherical shape like a rugby ball (FIG. 23F), a disc shape (FIG. 23G), or the like may be obtained.

Further, as shown in FIG. 1B, a wireless chip of the invention includes an antenna 101 and a layer 102 including a semiconductor element. The antenna 101 is a plane antenna formed by sandwiching a dielectric layer 106 between two conductive layers which are parallel to each other (a first conductive layer 103 and a second conductive layer 104). The antenna 101 transmits and receives electromagnetic waves so that the wireless chip wirelessly communicates with a reader/writer. The layer including a semiconductor element is formed of a plurality of circuits including a transistor, a capacitor, a diode, or the like and performs processing, storing, or the like of the data received from the reader/writer.

Figure 2B:
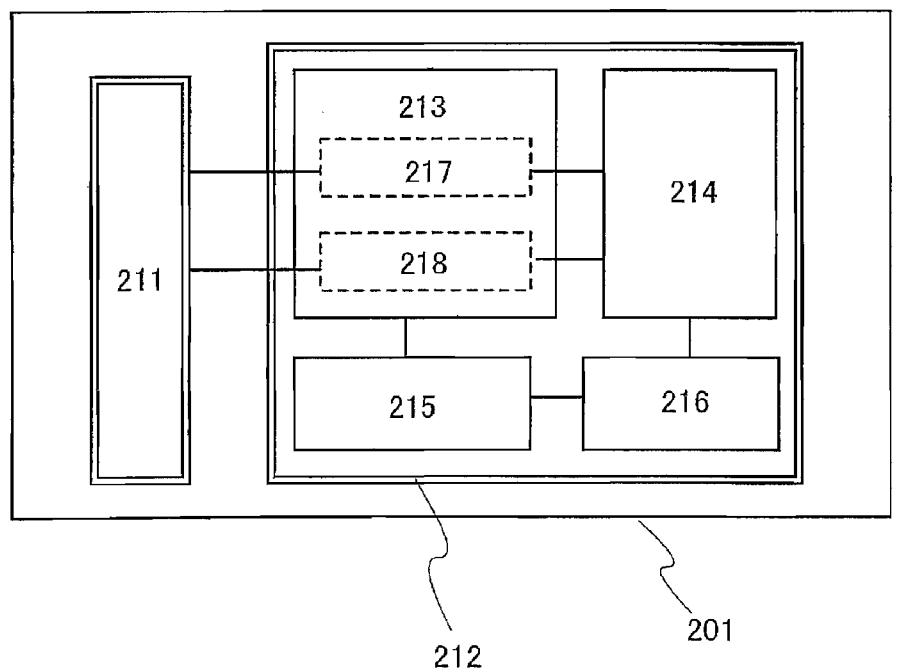

FIG. 2B shows a circuit configuration example of a wireless chip of the invention having the aforementioned function.

The wireless chip 201 of the invention includes an antenna 211, a layer 212 including a semiconductor element, a communication circuit portion 213, an arithmetic processing circuit portion 214, a power source circuit portion 215, a memory portion 216, a demodulation circuit 217, and a modulation circuit 218. The antenna 211 and the layer 212 including a semiconductor element are the same ones as the antenna 101 and the layer 102 including a semiconductor element shown in FIG. 1B.

The antenna receives electromagnetic waves emitted from the reader/writer and generates an alternating dielectric voltage. The dielectric voltage corresponds to a driving power of the wireless chip 201 and contains data from the reader/writer 202.

A frequency band of the electromagnetic waves used for the wireless communication between the reader/writer and the wireless chip is a long waveband of 30 to 135 kHz, a short waveband of 6 to 60 MHz (typically 13.56 MHz), an ultrashort waveband of 400 to 950 MHz, a microwave band of 2 to 25 GHz, or the like. The antenna can be appropriately designed in accordance with the frequency of electromagnetic waves used for the communication. Further, an antenna for communicating with the reader/writer and an antenna for supplying the driving power can be separately provided as well.

The layer 212 including a semiconductor element includes, for example, an arithmetic processing circuit portion, a memory, a communication circuit portion, a power source circuit portion, and the like.

The communication circuit portion includes a demodulation circuit and a modulation circuit. The demodulation circuit demodulates data received by the antenna from the reader/writer and outputs it to the arithmetic processing circuit portion. The modulation circuit modulates data stored in the memory and transmits it to the reader/writer. The arithmetic processing circuit portion performs operations such as determining the demodulated data from the reader/writer right or wrong or reading the data from the memory and outputting it to the modulation circuit.

The memory contains data specific to the wireless chip. Therefore, the memory includes a write once type nonvolatile memory, a rewritable nonvolatile memory, a volatile memory, or the like. The power source circuit portion generates a constant voltage from a dielectric voltage generated at the antenna and supplies the constant voltage as a driving voltage to each circuit. Further, the power source circuit portion may have a clock generating circuit or the like for generating a clock signal with a frequency required for other circuits.

Next, description is made on a manufacturing method of a wireless chip of the invention in the order from a method for forming an antenna, a method for forming a layer including a semiconductor element, and a method for connecting the antenna and the layer including a semiconductor element.

As shown in FIG. 1B, the antenna 101 which forms the wireless chip is formed larger and thicker than the layer 102 including a semiconductor element. The shape of a wireless chip of the invention is almost determined by the antenna 101. The antenna 101 has a structure in which the dielectric layer 106 is sandwiched between the first conductive layer 103 and the second conductive layer 104. The dielectric layer 106 almost determines the shape of the antenna 101. Therefore, the shape of a wireless chip of the invention can be determined by forming the dielectric layer 106 into a cylindrical shape in which outer edge portions thereof have curved surfaces as described above.

Further, the antenna 101 is formed by sandwiching the dielectric layer 106 between the first conductive layer 103 which functions as an emitter electrode and the second conductive layer 104 which functions as a ground. Power may be fed from the first conductive layer 103 to the layer including a semiconductor element by providing a power feeding layer 105. Furthermore, a power feeding point may be provided to feed power. In this embodiment mode, description is made on the antenna 101 having a structure with the power feeding layer 105.

In the antenna 101, the dielectric layer 106 is formed using a dielectric, a magnetic body, or the like and the conductive layers 103 and 104 are formed using a conductive substance over a surface of the dielectric layer.

Figure 3A:
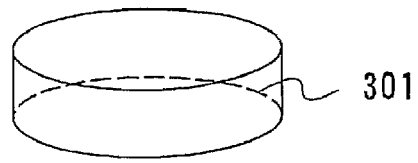
FIGS. 3A to 3D are views showing manufacturing steps of an antenna which forms a wireless chip of the invention.
Figure 3B:

As a method for forming the dielectric layer 106, as shown in FIG. 3A, a dielectric layer 301 in a cylindrical shape is formed (In the invention, the shape is not limited to a cylindrical shape and a polygonal prism shape can also be employed). As shown in FIG. 3B, by rounding off corners at which a top surface, a bottom surface, and a side surface intersect by grinding or the like, a dielectric layer 302 in a cylindrical shape in which outer edge portions thereof have curved surfaces is formed.

However, a dielectric layer of an antenna which forms a wireless chip of the invention is not limited to be formed by the aforementioned manufacturing method, and can also be formed into a cylindrical shape having in which outer edge portions thereof have curved surfaces by using a casting mold or the like. Furthermore, the dielectric layer may be formed into a spherical shape, an ovoid shape, an oval spherical shape like a go stone, an oval spherical shape like a rugby ball, a disc shape, or the like.

The dielectric layer 106 is formed by using ceramic with a high dielectric constant, an organic resin, a mixture thereof, or the like. As typical examples of ceramic, silica, alumina, zirconia, glass, forsterite, and the like are given. Besides, titanium barium neodymium-based ceramics, titanium barium tin-based ceramics, lead calcium-based ceramics, titanium dioxide-based ceramics, barium titanate-based ceramics, lead titanate-based ceramics, strontium titanate-based ceramics, calcium titanate-based ceramics, titanic acid bismuth-based ceramics, titanic acid magnesium-based ceramics, and the like are given. These materials may be used alone of in combination. It is to be noted that titanium dioxide-based ceramics corresponds to the one in which a crystal structure of titanium dioxide is held, including not only the one containing only titanium dioxide but also the one containing a small amount of other additives. Further, other ceramics may similarly contain a small amount of other additives.

As an organic resin, a thermosetting resin or a thermoplastic resin can be used. As examples of a thermosetting resin, an epoxy resin, a phenol resin, an unsaturated polyester resin, a vinyl ester resin, a polyimide resin, a polyphenylene ether resin, a bismaleimide-triazine resin, a polyfumarate resin, a polybutadiene resin, a polyvinyl benzyl ether compound resin, and the like are given. As examples of a thermoplastic resin, resin materials such as liquid crystal polymer, an aromatic polyester resin, a polyphenylene sulfide resin, a polyethylene terephthalate resin, a polybutylene telephthalate resin, a BT resin, a vinyl benzyl resin, a fluoroplastic resin, or the like can be given. Further, a plurality of organic resin materials may be mixed to be used.

In the case where the dielectric layer 106 is formed of a mixture of ceramic and an organic resin, it is preferable to disperse ceramic particles in the organic resin. At this time, it is preferable that the ceramic be contained in the dielectric layer by 20 to 60 volume %. Further, a particle size of ceramic is preferably 1 to 50 μm. Moreover, it is preferable that the dielectric constant of the dielectric layer 106 be 2.6 to 150, and more preferably 2.6 to 40. By using a ferroelectric material with a high dielectric constant, a volume of an antenna can be made small.

The dielectric layer 106 which forms the antenna is not limited to be formed of the ceramic and organic resins described above, but can be formed of a material selected for the purpose in consideration of a forming property, a workability, an adhesion property, and the like.

Figure 3C:
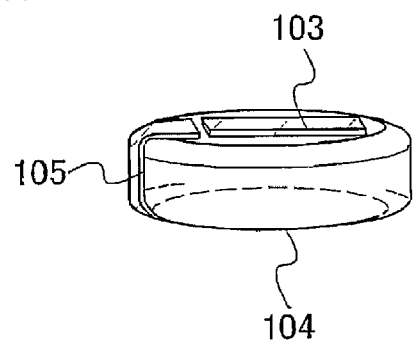

Next, as shown in FIG. 3C, the two conductive layers 103 and 104, and the power feeding layer 105 are formed over the surface of the dielectric layer 302 which has a cylindrical shape in which outer edge portions thereof have curved surfaces.

The two conductive layers 103 and 104 and the power feeding layer 105 can be formed over the surface of the dielectric layer 302 using a conductive substance by a printing method, a plating method, or the like.

Further, the two conductive layers 103 and 104 and the power feeding layer 105 can be formed by forming a conductive layer over the entire surface of the dielectric layer 302 by an evaporation method, a sputtering method, or the like and processing the conductive layer into a desired shape by etching.

As examples of conductive substances as materials of the two conductive layers 103 and 104, and the power feeding layer 105, a metal such as gold, silver, copper, palladium, platinum, and aluminum, an alloy thereof, or the like can be used.

The second conductive layer 104 and the power feeding layer 105 formed as described above are electrically connected to the layer 102 including a semiconductor element. In specific, the second conductive layer 104 is connected to a portion of the layer including a semiconductor element, where a ground potential is applied, and the power feeding layer 105 is connected to the power source circuit portion, the communication circuit portion, and the like described with reference to FIG. 2B. Therefore, the aforementioned antenna preferably has a shape which can be easily connected to the layer 102 including a semiconductor element.

Further, it is preferable that the size of the antenna be several mm×several mm to several tens mm×several tens mm. Typically, the size is about 7×7 mm to 12×12 mm. Moreover, the thickness of the antenna is about 1 to 15 mm, and typically 1.5 to 5 mm. The size of the antenna determines the size of the wireless chip.

Next, description is made on a manufacturing method of a layer including a semiconductor element.

The layer including a semiconductor element, which forms a wireless chip of the invention includes a plurality of circuits formed of semiconductor elements and a memory formed of a semiconductor element and a memory element. Therefore, in this embodiment mode, description is made on a manufacturing method of a semiconductor element and a memory element.

Here, in order to form a layer including a thin and small semiconductor element which can be attached to the antenna formed as described above, description is made on a method for forming a semiconductor element formed using a thin semiconductor film and an organic memory including a memory element using an organic compound.

An organic memory has a structure in which a layer containing an organic compound or a mixed layer of an organic compound and an inorganic compound is sandwiched between a pair of conductive layers. A decoder or the like which forms a memory may be formed by a known technique. Further, a memory cell which forms a memory is formed of only the memory element or a transistor and the memory element. In this specification, the layer containing an organic compound or the mixed layer of an organic compound and an inorganic compound are collectively referred to as an organic compound layer.

An organic compound layer included in a memory element is formed using a substance of which crystalline state, conductive property, or the like changes when light, heat, or an electrical effect is applied. A memory element with this structure stores a binary value state depending on a state where the organic compound layer is changed by the aforementioned light, heat, or an electrical effect or a state with no effect to cause a change. This memory element having a simple structure can be easily formed thin.

Figure 4A:
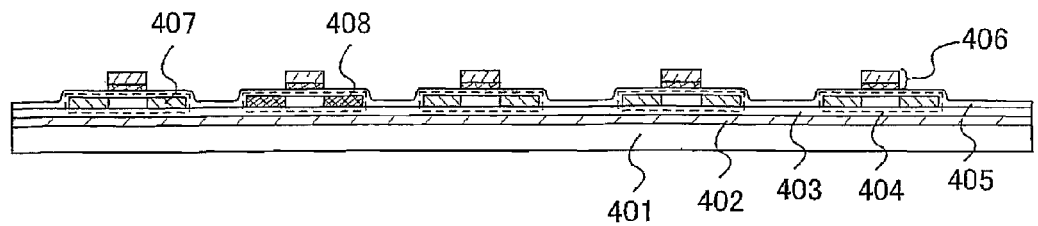
FIGS. 4A to 4C are sectional views of semiconductor elements which forms a wireless chip.

First, a peeling layer 402 is formed over an insulating substrate 401 (see FIG. 4A). The insulating substrate 401 can be formed of a substrate formed of glass, quartz, silicon, a metal, or the like. The peeling layer 402 is formed by forming an element or a compound such as a metal and silicon over the entire surface or a part of the substrate. It is to be noted in this embodiment mode that the peeling layer 402 is formed to peel off the layer including a semiconductor element formed over the insulating substrate 401 and attaching it to an antenna. However, in the case where the layer including a semiconductor element formed over the insulating substrate 401 is attached to an antenna together with the insulating substrate 401, the peeling layer 402 is not required to be formed. Next, an insulating layer 403 is formed so as to cover the peeling layer 402. The insulating layer 403 is formed of silicon oxide, silicon nitride, or the like. Next, a semiconductor layer 404 is formed over the insulating layer 403 and crystallized by laser crystallization, thermal crystallization using a metal catalyst, or the like, and then processed into a desired shape. Next, a gate insulating layer 405 is formed so as to cover the semiconductor layer. The gate insulating layer 405 is formed of silicon oxide, silicon nitride, or the like. As the gate insulating layer 405, an insulating layer with a thin thickness and a high insulating property can be formed by deposition using a high density plasma CVD apparatus.

Figure 4B:
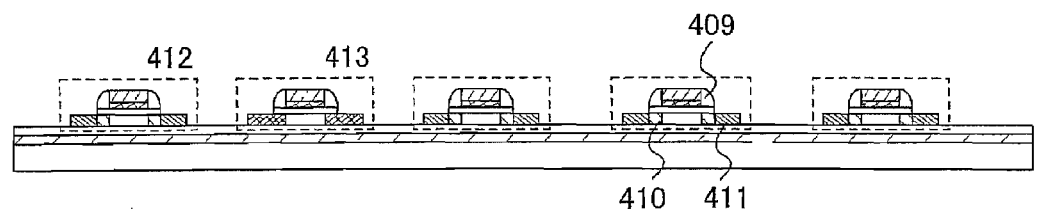

Next, a gate electrode layer 406 is formed. The gate electrode layer 406 is formed of a conductive layer using a conductive element or compound and processed into a desired shape. In the case of processing the layer by a photolithography method, a resist mask may be etched by plasma or the like, thereby the width of a gate electrode can be formed narrow and the performance of a transistor can be enhanced. FIG. 4A shows the case where the gate electrode layer is formed to have a stacked-layer structure. Next, an n-type impurity region 407 and a p-type impurity region 408 are formed by adding impurity elements to the semiconductor layer 404. The impurity region is formed by forming a resist mask by a photolithography method and adding impurity elements such as phosphorus, arsenic, boron, or the like thereto. Subsequently, an insulating layer is formed of nitrogen compound or the like and anisotropic etching in a perpendicular direction is applied to the insulating layer, thereby an insulating layer 409 (sidewall) in contact with a side surface of the gate electrode is formed (see FIG. 4B). Subsequently, impurities are added to the semiconductor layer including the n-type impurity region, thereby a first n-type impurity region 410 right under the sidewall 409 and a second n-type impurity region 411 having a higher impurity concentration than that of the first n-type impurity region 410 are formed. By the aforementioned steps, an n-type transistor 412 and a p-type transistor 413 are formed.

Figure 4C:
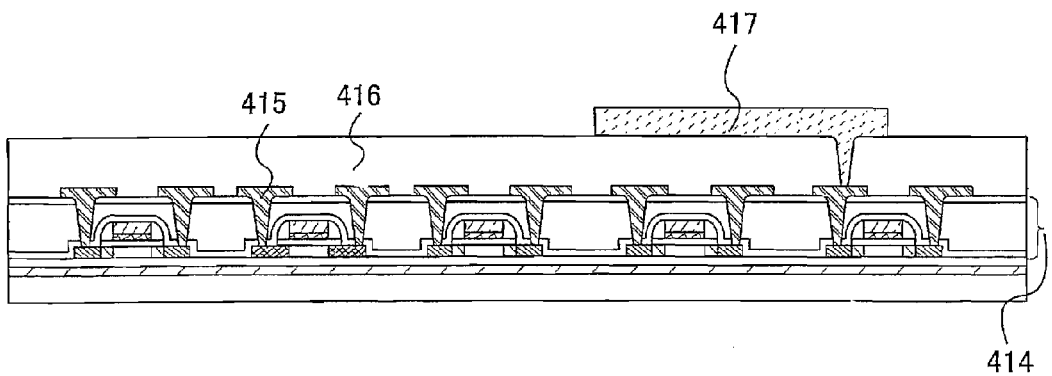

Next, an insulating layer 414 is formed so as to cover the transistors 412 and 413 (see FIG. 4C). The insulating layer 414 is formed of an inorganic compound, an organic compound, or the like having an insulating property. In FIG. 4C, the insulating layer 414 is formed to have a stacked-layer structure. Next, contact holes to expose the second n-type impurity region 411 and the p-type impurity region 408 are formed and a conductive layer 415 is formed to fill the contact holes and processed into a desired shape. The conductive layer 415 is formed of a metal element, a compound, or the like having a conductive property. Next, an insulating layer 416 is formed so as to cover the conductive layer 415. The insulating layer 416 is formed of an inorganic compound, an organic compound, or the like having an insulating property.

Figure 5A:
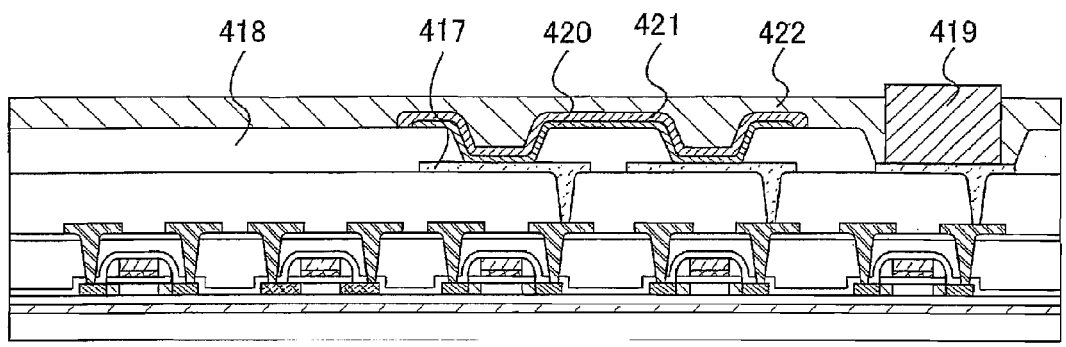
FIGS. 5A and 5B are views showing manufacturing steps of semiconductor elements and memory elements which form a wireless chip.

Next, FIG. 5A shows the formation of a memory element. First, a contact hole to expose the conductive layer 415 is formed and a first conductive layer 417 is formed so as to fill the contact hole. The first conductive layer 417 is formed of a metal element, a compound, or the like having a conductive property, thereby a first conductive layer which constitutes a memory element is formed. The insulating layer 418 is formed of an inorganic compound, an organic compound, or the like having a high insulating property in order to electrically isolate adjacent memory elements. Subsequently, a contact hole to expose the first conductive layer 417 is formed. Then, a wire 419 is formed over the first conductive layer 417 to connect an antenna. Next, an organic compound layer 420 is formed to be in contact with the first conductive layer 417, and then a conductive layer 421 is formed. The organic compound layer 420 is formed of an organic compound of which electrical characteristics change when an electrical effect is applied. The conductive layer 421 is formed of a metal element, a compound, or the like having a conductive property and functions as a second conductive layer which constitutes the memory element. Next, a protective layer 422 is formed. The protective layer 422 is formed of a compound, a resin, or the like having an insulating property.

Figure 5B:
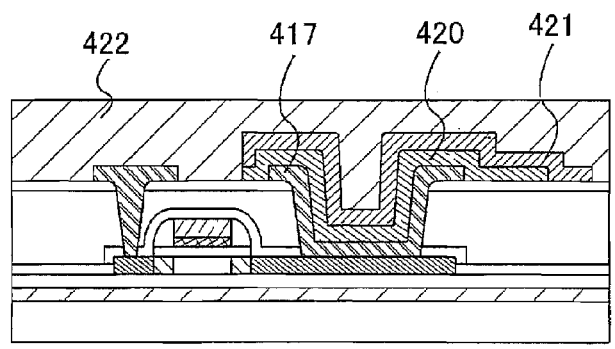

FIG. 5B shows a memory element with a different structure than the aforementioned memory element. In the memory element, the conductive layer 415 formed to connect the transistor and the memory element in FIG. 4C is used as the first conductive layer of the memory element. First, contact holes to expose the second n-type impurity region 411 and the p-type impurity region 408 are formed and a conductive layer 415 is formed to fill the contact holes and processed into a desired shape. The conductive layer 415 functions as a first conductive layer which constitutes the memory element. Next, an organic compound layer 420 is formed so as to contact with the conductive layer 415, and then the conductive layer 421 is formed. The organic compound layer 420 is formed of an organic compound of which electrical characteristics change when an electrical effect is applied. The conductive layer 421 is formed of a metal element, a compound, or the like having a conductive property and functions as a second conductive layer which constitutes the memory element. Next, the protective layer 422 is formed. The protective layer 422 is formed of a compound, a resin, or the like having an insulating property. In this manner, by forming the memory element in the contact hole, a small and thin semiconductor device can be formed. Moreover, as the first conductive layer 417 and the insulating layer 418 are not required, the manufacturing steps can be reduced and a memory at lower cost can be provided.

Each of an insulating layer, a conductive layer, and an element can be formed of a single layer structure of a single material or a stacked-layer structure of a plurality of materials.

The semiconductor layer including a semiconductor element, which is formed by the aforementioned steps may use any one of an amorphous semiconductor, a microcrystal semiconductor, a polycrystal semiconductor, an organic semiconductor, and the like. In order to obtain a semiconductor element with favorable characteristics, a crystalline semiconductor layer (low temperature polysilicon layer) crystallized at 200 to 600° C. (preferably 350 to 500° C.) or a crystalline semiconductor layer (high temperature polysilicon layer) crystallized at 600° C. or higher can be used. In order to obtain a semiconductor element with further favorable characteristics, a semiconductor layer crystallized using a metal element as a catalyst or a semiconductor layer crystallized by a laser irradiation method may be used. Moreover, a semiconductor layer formed by a plasma CVD method using a mixture gas of $SiH_4$ and $F_2$, a mixture gas of $SiH_4$ and $H_2$, or the like or thus formed the semiconductor layer irradiated with laser may be used. A semiconductor layer of a semiconductor element in a circuit is preferably formed to have a crystal boundary which extends in parallel to a direction of a carrier flow (a channel length direction). Such an active layer can be formed by a continuous wave laser (can be abbreviated to CWLC) or a pulsed laser which operates at 10 MHz or higher, or preferably 60 to 100 MHz. Moreover, the thickness of the semiconductor layer is preferably 20 to 200 nm, and more preferably 50 to 150 nm. By adding a hydrogen or halogen element to the semiconductor layer (in particular, a channel forming region) at a concentration of $1\times10^{19}$ to $1\times10^{22}$ atoms/cm$^3$ or preferably at a concentration of $1\times10^{19}$ to $5\times10^{20}$ atoms/cm$^3$, an active layer which has few defects and hardly cracks can be obtained.

A transistor formed as described above has an S value (sub-threshold value) of 0.35 V/dec or lower and more preferably 0.09 to 0.25 V/dec. The mobility is preferably 10 cm$^2$/Vs or higher. Further, the transistor preferably has characteristics of 1 MHz or higher and more preferably 10 MHz or higher by a ring oscillator which operates with a power source voltage of 3 to 5 V. The transistor described in this embodiment mode has a structure in which a semiconductor layer, a gate insulating layer, and a gate electrode layer are sequentially stacked over a substrate, however, the invention is not limited to this example. For example, a structure in which a gate electrode layer, an insulating film, and a semiconductor layer are sequentially stacked may be employed as well. Further, in this embodiment mode, an n-type transistor has a first n-type impurity region and a second n-type impurity region, however, the invention is not limited to this and the impurity regions may have the same impurity concentrations.

A material of which quality or condition changes by an electrical effect, an optical effect, a thermal effect, or the like is used as a material for the organic compound layer. For example, a material having an organic compound of which quality or condition changes when a voltage is applied, so that a first conductive layer and a second conductive layer which constitute a memory element are short-circuited is used. Therefore, the thickness of the organic compound layer is set 5 to 100 nm, and more preferably 10 to 60 nm. Such an organic compound layer can be formed of an inorganic material or an organic material as follows by an evaporation method, a spin coating method, a droplet discharge method, or the like.

As a material for the organic compound layer, for example, an aromatic amine-based compound (that is, having a benzene ring-nitrogen bond) such as 4,4'-bis[N-(1-naphthyl)-N-phenyl-ammo]-biphenyl (abbreviated to α-NPD), 4,4'-bis[N-(3-methylphenyl)-N-phenyl-amino]-biphenyl (abbreviated to TPD), 4,4',4"-tris(N,N-diphenyl-amino)-triphenylamine (abbreviated to TDATA), 4,4',4"-tris[N-(3-methylphenyl)-N-phenyl-amino]-triphenylamine (abbreviated to MTDATA), and 4,4'-bis[N-(4-(N,N-di-m-tolylamino)phenyl-N-phenylamino]biphenyl (abbreviated to DNTPD), polyvinyl carbazole (abbreviated to PVK), a phthalocyanine compound such as phthalocyanine (abbreviated to $H_2Pc$), copper phthalocyanine (abbreviated to CuPc), or vanadyl phthalocyanine (abbreviated to VOPc), or the like can be used. These materials have a high hole transporting property.

Besides, a material formed of a metal complex or the like having a quinoline skeleton or a benzoquinoline skeleton such as tris(8-quinolinolato)aluminum (abbreviated to $Alq_3$), tris(4-methyl-8-quinolinolato)alurninum (abbreviated to $Almq_3$), bis(10-hydroxybenzo[h]-quinolinato)beryllium (abbreviated to $BeBq_2$), or bis(2-methyl-8-quinolinolato)-4-phenylphenolato-aluminum (abbreviated to BAlq), a metal complex having a oxazole-based or thiazole-based ligand such as bis[2-(2-hydroxyphenyl)-benzoxazolate]zinc (abbreviated to $Zn(BOX)_2$), or bis[2-(2-hydroxyphenyl)benzothiazolate]zinc (abbreviated to $Zn(BTZ)_2$), and the like can be used. These materials have a high electron transporting property.

Other than the metal complexes, in addition, there are 2-(4-biphenylyl)-5-(4-tert-butylphenyl)-1,3,4-oxadiazole (abbreviated to PBD), 1,3-bis[5-(p-tert-butylphenyl)-1,3,4-oxadiazole-2-yl]benzene (abbreviated to OXD-7), 3-(4-tert-butylphenyl)-4-phenyl-5-(4-biphenylyl)-1,2,4-triazole (abbreviated to TAZ), 3-(4-tert-butylphenyl)-4-(4-ethylphenyl)-5-(4-biphenylyl)-1,2,4-friazole (abbreviated to p-EtTAZ), bathophenanthroline (abbreviated to BPhen), bathocuproin (abbreviated to BCP), and the like.

The organic compound layer may have a single layer structure or a stacked-layer structure. In the case of a stacked-layer structure, the aforementioned materials can be selected to form a stacked-layer structure. Further, the aforementioned organic compound material and a light emitting material may be stacked. As a light emitting material, 4-dicyanomethylene-2-methyl-6-[2-(1,1,7,7-tetramethyljulolidin-9-yl)ethenyl]-4H-pyra n (abbreviated to DCJT), 4-dicyanomethylene-2-t-butyl-6-[2-(1,1,7,7-tetramethyljulolidin-9-yl)ethenyl]-4H-pyran, periflanthene, 2,5-dicyano-1,4-bis[(10-methoxy-1,1,7,7-tetramethyljulolidin-9-yl)ethenyl] benzene, N,N'-dimethylquinacridone (abbreviated to DMQd), coumarin 6, coumarin 545T, tris(8-quinolinolato) aluminum (abbreviated to $Alq_3$), 9,9'-bianthlyl, 9,10-diphenylanthracene (abbreviated to DPA), 9,10-bis(2-naphthyl) anthracene (abbreviated to DNA), 2,5,8,11-tetra-t-buthylperylene (abbreviated to TBP), and the like are given.

A layer in which the above light-emitting material is dispersed may be used. In the layer in which the above light-emitting material is dispersed, an anthracene derivative such as 9,10-di(2-naphthyl)-2-tert-butylanthracene (abbreviated to t-BuDNA), a carbazole derivative such as 4,4'-di(N-carbazolyl) biphenyl (abbreviated to CBP), a metal complex such as bis[2-(2'-hydroxyphenyl)pyridinato] zinc (abbreviated to $Znpp_2$) or bis[2-(2'-hydroxyphenyl)benzoxazolate] zinc (abbreviated to ZnBOX), or the like can be used as a host material. In addition, tris(8-quinolinolato)aluminum (abbreviated to Alq3), 9,10-bis(2-naphthyl) anthracene (abbreviated to DNA), bis(2-methyl-8-quinolinolato)-4-phenylphenolate-aluminum (abbreviated to BAlq), or the like can be used.

Such an organic compound material changes its quality by a thermal effect, or the like, therefore, a glass transition temperature (Tg) is preferably 50 to 300° C., and more preferably 80 to 120° C.

In addition, a material in which metal oxide is mixed with an organic compound material or a light-emitting material may be used. Note that the material in which metal oxide is mixed includes a state in which metal oxide is mixed or stacked with the above organic compound material or the above light-emitting material. Specifically, it indicates a state which is formed by a co-evaporation method using multiple evaporation sources. Such a material can be referred to as an organic-inorganic composite material.

For example, in the case of mixing a substance having a high hole transporting property with a metal oxide, it is preferable to use vanadium oxide, molybdenum oxide, niobium oxide, rhenium oxide, tungsten oxide, ruthenium oxide, titanium oxide, chromium oxide, zirconium oxide, hafnium oxide, and tantalum oxide as the metal oxide.

In the case of mixing a substance having a high electron transporting property with a metal oxide, lithium oxide, calcium oxide, sodium oxide, potassium oxide, or magnesium oxide is preferably used as the metal oxide.

A material which is changed in its property by an electrical effect, an optical effect, or a thermal effect can be used for the organic compound layer; therefore, for example, a conjugated polymer doped with a compound (photoacid generator) which generates acid by absorbing light can also be used. Here, as the conjugated polymer, polyacetylenes, polyphenylene vinylenes, polythiophenes, poly anilines, polyphenylene ethinylenes, or the like can be used. As the photoacid generator, aryl sulfonium salt, aryl iodonium salt, o-nitrobenzyl tosylate, aryl sulfonic acid p-nitrobenzyl ester, sulfonyl acetophenones, Fe-arene complex $PF_6$ salt, or the like can be used.

The first conductive layer and the second conductive layer which constitute a memory element can be formed of a conductive material. For example, a film formed of an element selected from aluminum (Al), titanium (Ti), molybdenum (Mo), tungsten (W), and silicon (Si), or an alloy film using these elements thereof can be used. Moreover, a light transmissive material such as indium tin oxide (ITO), indium tin oxide containing silicon oxide, and indium oxide containing zinc oxide can be used. Further, silicon oxide or silicon nitride can be used for an inorganic material as a material for the protective layer 422. As an organic material, polyimide, acrylic, polyamide, polyimide amide, resist, benzocyclobutene, siloxane, or polysilazane can be used. It is to be noted that a siloxane resin corresponds to a resin containing a Si—O—Si bond. Siloxane has a skeleton structure formed of a bond of silicon (Si) and oxygen (O). As a substituent, an organic group containing at least hydrogen (for example, alkyl group and aromatic hydrocarbon) is used. As a substituent, a fluoro group may be used. Alternatively, an organic group containing at least hydrogen and a fluoro group may be used as a substituent. Polysilazane is formed of a polymer material having a bond of silicon (Si) and nitrogen (N) as a start material. By forming a protective layer using these materials, planarity can be enhanced and impurities can be prevented from entering.

A semiconductor element and a memory element may be provided for a plurality of layers. In the case of a multi-layer structure, it is preferable to use a low dielectric constant material as a material for an interlayer insulating film in order to reduce the parasitic capacitance between the layers. For example, a resin material such as an epoxy resin and an acrylic resin, a compound material formed of a polymer such as a siloxane-based polymer, and the like are given. When the parasitic capacitance is reduced in the multi-layer structure, small size, high rate operation, and low power consumption can be realized. By providing a protective layer for preventing contamination of an alkali metal, reliability can be improved. The protective layer is preferably provided so that an inorganic material such as aluminum nitride and a silicon nitride film wraps around the semiconductor element in the circuit or the whole circuit.

Next, description is made on a method for peeling the semiconductor element and the memory element formed as described above from the insulating substrate 401 and attaching it to the antenna.

Figure 6A:
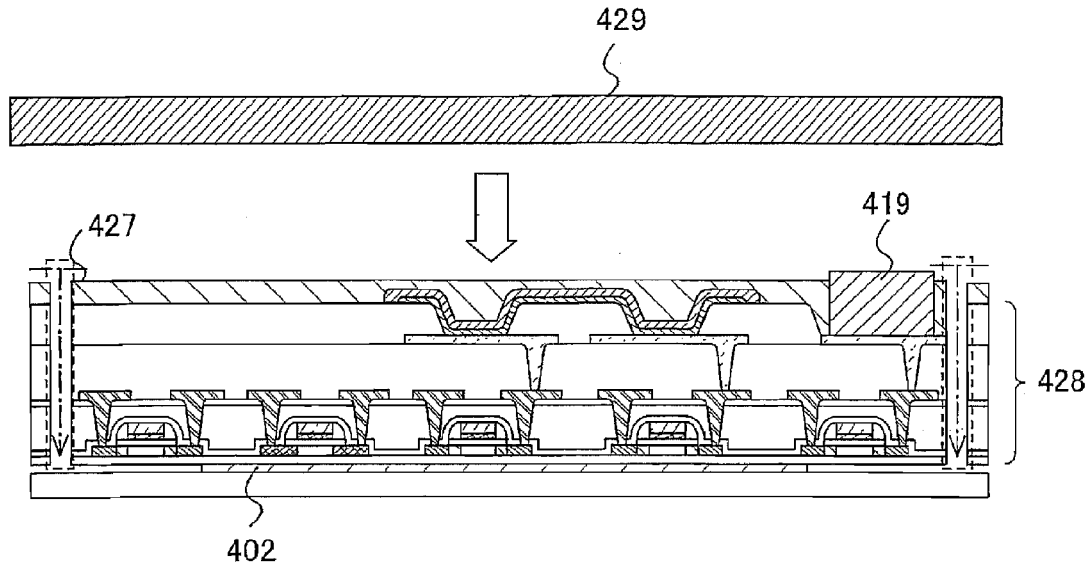
FIGS. 6A to 6C are views showing manufacturing steps of semiconductor elements and memory elements which form a wireless chip.
Figure 6B:
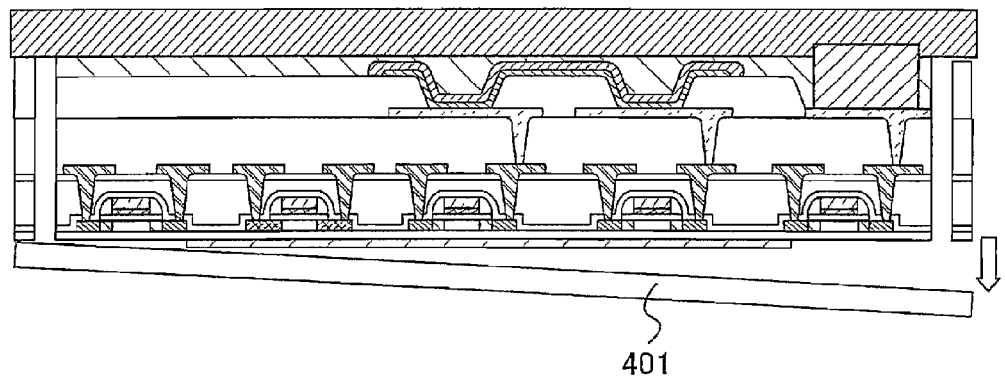
Figure 6C:
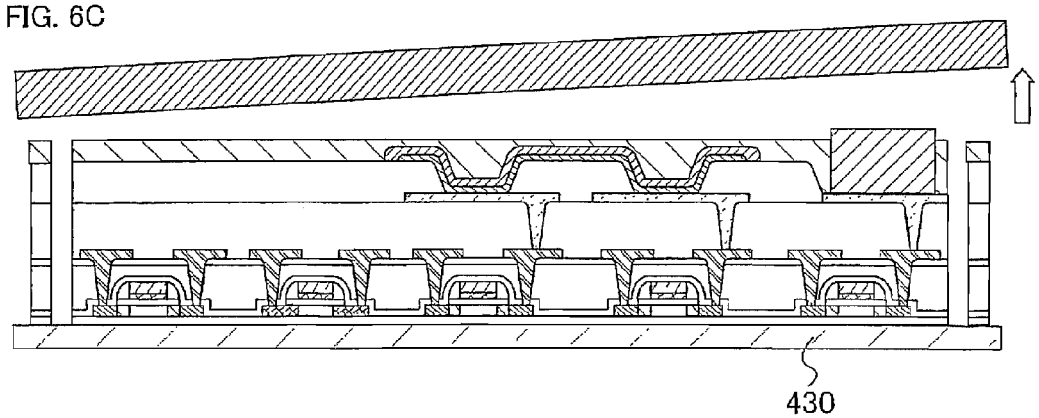

First, an aperture 427 is formed so as to expose the peeling layer 402 and etchant is introduced therein, thereby the peeling layer 402 is partially removed (see FIG. 6A). Next, a first flexible substrate 429 (for example, a plastic film) is adhered from a direction of the top surface of the insulating substrate 401. Then, a layer 428 including a semiconductor element and a memory element is peeled off from the insulating substrate 401. In this manner, the layer 428 including a semiconductor element and a memory element can be transferred to the first flexible substrate 429 side. At this time, a material of the peeling layer may remain on the layer including a semiconductor element and a memory element. Subsequently, a second flexible substrate 430 (for example, a thin plastic film) is adhered to the side of the layer 428 including a semiconductor element and a memory element, which was in contact with the insulating substrate 401 (see FIG. 6B). By removing the first flexible substrate 429, the wire 419 to be connected to the antenna is exposed (see FIG. 6C).

At this time, it is preferable that the thickness of the layer 428 including a semiconductor layer and a memory element be 5 μm or thinner, or more preferably 1 to 3 μm. Moreover, in the case of attaching a layer including a semiconductor element to an antenna having a curved surface, the semiconductor element can be less affected when a direction of a carrier flow of the semiconductor element (the channel length direction) is set to be parallel to a tangential line to the curved surface, in which an angle between the curved surface and the tangential line at the portion to which the semiconductor element is attached is minimized.

The layer including a semiconductor element, which is formed over the second flexible substrate 430 corresponds to the layer 102 including a semiconductor element shown in FIG. 1B.

Figure 3D:
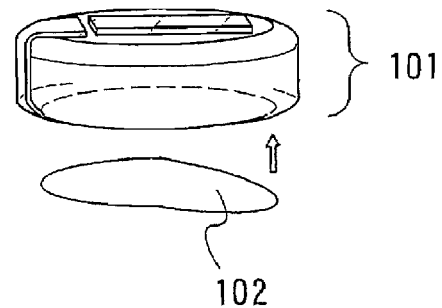

Next, as shown in FIG. 3D, the antenna 101 formed by the aforementioned steps and the layer 102 including a semiconductor element are attached to each other so as to be electrically connected. It is preferable to use an anisotropic conductive adhesive for the attachment. In specific, attachment is carried out so that the second conductive layer 104 of the antenna is connected to a portion of the layer including a semiconductor element, to which a ground potential is applied, and the power feeding layer 105 is connected to the power source circuit portion, the communication circuit portion, or the like described with reference to FIG. 2B.

The invention can provide a wireless chip which is small in size, favorable in communication property, and inexpensive. Further, a wireless chip of the invention has a cylindrical shape in which outer edge portions thereof have curved surfaces. In specific, a corner at which a top surface, a bottom surface, and a side surface of the cylindrical shape intersect is rounded off by grinding or the like, thereby a shape having only a flat surface and a curved surface is obtained. Besides, a shape with no corner may be obtained by forming a polygonal prism shape such as a quadratic prism and rounding off corners at which a top surface, a bottom surface, and side surfaces intersect and corners at which side surfaces intersect. Furthermore, a spherical shape, an ovoid shape, an oval spherical shape like a go stone, an oval spherical shape like a rugby ball, a disc shape, or the like may be obtained, thereby a wireless chip can be provided with high safety which does not cause an injury or the like when touched.

[Embodiment Mode 2]

In this embodiment mode, description is made on a different manufacturing method of the wireless chip of the invention with the function described in Embodiment Mode 1.

Figure 7A:
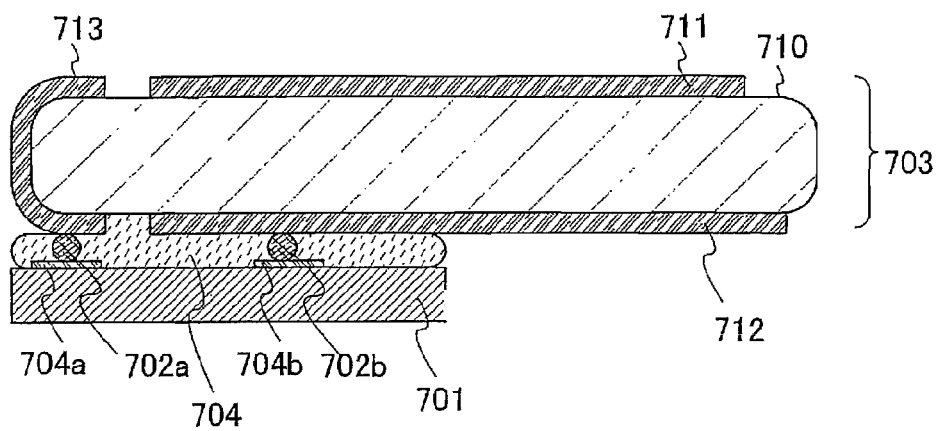
FIGS. 7A and 7B are sectional views of a wireless chip of the invention.

As shown in FIG. 7A, a wireless chip of this embodiment mode includes a layer 701 including a semiconductor element and an antenna 703. The layer 701 including a semiconductor element has a semiconductor element such as a field effect transistor over a semiconductor substrate formed of silicon or the like. Moreover, the antenna may be similar to the antenna described in Embodiment Mode 1.

In the wireless chip of this embodiment mode, the antenna 703 and the layer 701 including a semiconductor element are connected through conductive layers 702a and 702b. In specific, a connecting terminal 704a formed over the surface of the layer 701 including a semiconductor element is connected to a power feeding layer 713 of the antenna through the conductive layer 702a. Then, a connecting terminal 704b formed over the surface of the layer 701 including a semiconductor element and the conductive layer 712 which functions as a ground of the antenna are connected through the conductive layer 702b. Moreover, a connection portion between the antenna 703 and the layer 701 including a semiconductor element may be filled with an under-fill material 704 as well.

The antenna 703 includes a dielectric layer 710, two conductive layers (a first conductive layer 711 and the second conductive layer 712) and the power feeding layer 713. The dielectric layer 710 has a cylindrical shape in which outer edge portions thereof have curved surfaces similarly to Embodiment Mode 1. In specific, corners at which a top surface, a bottom surface, and a side surface of the cylindrical shape intersect are rounded off by grinding, thereby a shape having only a flat surface and a curved surface is obtained. Besides, a shape with no corner may be obtained by forming a polygonal prism shape such as a quadratic prism and rounding off corners at which a top surface, a bottom surface, and a side surface intersect and corner at which side surfaces intersect. Furthermore, a spherical shape, an ovoid shape, an oval spherical shape like a go stone, an oval spherical shape like a rugby ball, a disc shape, or the like may be obtained.

The first conductive layer 711 formed over one surface of the dielectric layer 710, the second conductive layer 712 formed over another surface of the dielectric layer 710 so as to oppose the first conductive layer 711 through the dielectric layer, and the power feeding layer 713 are provided. The first conductive layer 711 functions as an emitter electrode. Moreover, the second conductive layer 712 functions as a ground. The power feeding layer 713 is provided so as not to contact the first conductive layer 711 and the second conductive layer 712. Further, power is fed from the antenna to the layer including a semiconductor element or from the layer including a semiconductor element to the antenna through the power feeding layer 713. It is to be noted that power may be fed by using a power feeding point instead of the power feeding layer.

Here, description is made on the structure of the antenna 703. The dielectric layer 710 of the antenna can be formed of ceramic, an organic resin, a mixture of ceramic and an organic resin, or the like. As typical examples of ceramic, alumina, glass, forsterite, and the like are given. Furthermore, a plurality of kinds of ceramic may be mixed and used. In order to obtain a high dielectric constant, it is preferable to form the dielectric layer 710 by a ferroelectric material. As typical examples of the ferroelectric material, barium titanate (BaTiO$_3$), lead titanate (PbTiO$_3$), strontium titanate (SrTiO$_3$), lead zirconate (PbZrO$_3$), lithium niobate (LiNbO$_3$), lead zirconate titanate (PZT), and the like are given. Further, a plurality of kinds of ferroelectric materials may be mixed and used.

Moreover, as an organic resin, a thermosetting curable resin or a thermoplastic resin is appropriately used. As typical examples of an organic resin, an epoxy resin, a phenol resin, a poly butadiene resin, a BT resin, vinyl benzyl, poly fumarate, a fluorocarbon resin, and the like can be given. Further, a plurality of kinds of organic resin materials may be mixed and used.

In the case where the dielectric layer 710 is formed of a mixture of ceramic and an organic resin, it is preferable to disperse particulate ceramic particles into the organic resin. At this time, it is preferable that the ceramic be contained in the dielectric layer 710 by 20 to 60 volume %. Further, a particle size is preferably 1 to 50 μm.

It is preferable that the dielectric constant of the dielectric layer 710 be 2.6 to 150, or more preferably 2.6 to 40. By using a ferroelectric material with a high dielectric constant, the volume of the antenna can be reduced.

The first conductive layer 711, the second conductive layer 712, and the power feeding layer 713 can be formed of a metal selected from gold, silver, copper, palladium, platinum, and aluminum, an alloy thereof, or the like. Moreover, the first conductive layer 711, the second conductive layer 712, and the power feeding layer 713 can be formed by a printing method or a plating method. Further, each conductive layer can be formed by depositing a conductive layer over the dielectric film by an evaporation method or a sputtering method and etching a portion thereof.

Figure 8:
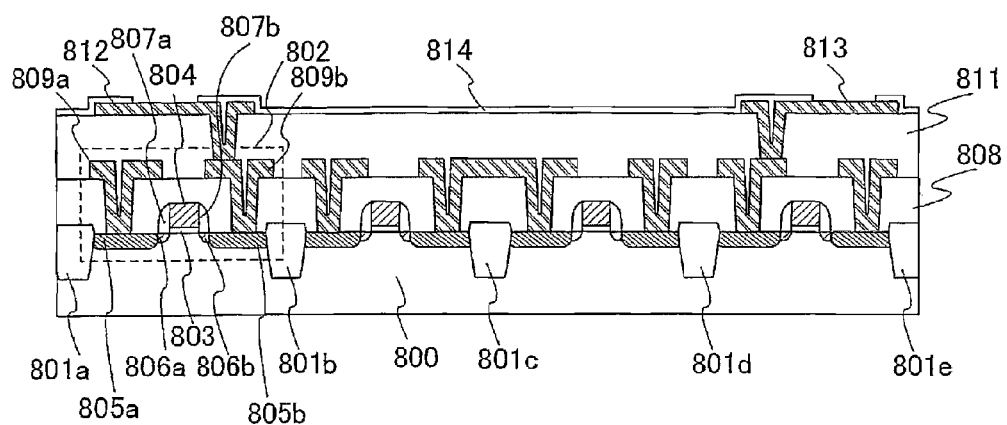
FIG. 8 is a sectional view of a semiconductor element which forms a wireless chip of the invention.

Next, description is made with reference to FIG. 8 on the layer 701 including a semiconductor element.

FIG. 8 is a sectional view of a portion of the layer 701 including a semiconductor element. Over a substrate 800, element isolating regions 801a to 801e are formed, between each of which a semiconductor element 802 such as a field effect transistor is formed.

The semiconductor element 802 includes a gate insulating film 803 formed over a single crystal semiconductor substrate, a gate electrode 804 formed over the gate insulating film, a source region and a drain region 805a and 805b in the single crystal semiconductor substrate, an interlayer insulating layer 811 formed over the gate electrode, and a source wire and a drain wire 809a and 809b connected to the source region and the drain region 805a and 805b respectively. It is to be noted that sidewalls 807a and 807b formed on side surfaces of the gate electrode 804 and the gate insulating film 803 and low concentration impurity regions 806a and 806b covered with the sidewalls 807a and 807b in the single crystal semiconductor substrate may be included as well.

The substrate 800 is a single crystal semiconductor substrate or a compound semiconductor substrate, which is typically an n-type or p-type single crystal silicon substrate, a GaAs substrate, an InP substrate, a GaN substrate, a SiC substrate, a sapphire substrate, a ZnSe substrate, or the like. Moreover, an SOI substrate (Silicon On Insulator) can also be used. In this embodiment mode, an n-type single crystal silicon substrate is used as the substrate 800.

The element isolating regions 801a to 801e are formed by a known selective oxidation method (LOCOS (Local Oxidation of Silicon) method), a trench isolation method, or the like. Here, a silicon oxide layer is formed by the trench isolation method as the element isolating regions 801a to 801e.

The gate insulating film 803 is formed by thermally oxidizing the single crystal semiconductor substrate. The gate electrode 804 may be formed of a polycrystal silicon layer with a thickness of 100 to 300 nm or a stacked-layer structure formed by providing a silicide layer such as a tungsten silicide layer, a molybdenum silicide layer, and a cobalt silicide layer over the polycrystal silicon layer. Further, a tungsten nitride layer and a tungsten layer may be stacked over the polycrystal silicon layer.

The source region and the drain region 805a and 805b can be formed of an $n^+$ region formed by adding phosphorus to a p-well region and a $p^+$ region formed by adding boron to an n-well region. The low concentration impurity regions 806a and 806b can be formed of an $n^-$ region formed by adding phosphorus to a p-well region and a $p^-$ region formed by adding boron to an n-well region. It is to be noted that silicide such as manganese silicide, tungsten silicide, titanium silicide, cobalt silicide, and nickel silicide may be included in the source region and the drain region 805a and 805b. By providing suicide to the surfaces of the source region and the drain region, connection resistance between the source wire and the drain wire and the source region and the drain region can be reduced.

The sidewalls 807a and 807b can be formed by forming an insulating layer of silicon oxide over the substrate by a CVD method and applying anisotropic etching to the insulating layer by an ME (Reactive Ion Etching) method.

An interlayer insulating layer 808 is formed of an inorganic insulating material such as silicon oxide and silicon oxynitride or an organic insulating material such as an acryl resin and a polyimide resin. In the case of employing a coating method such as spin coating or a roll coater, silicon oxide formed by applying an insulating film material dissolved in an organic solvent and then by thermal process to form an insulating layer may be used. Here, the interlayer insulating layer 808 is formed of silicon oxide.

The source wire and the drain wire 809a and 809b are preferably formed of a combination of a low resistance material such as aluminum (Al) and a barrier metal using a high melting point metal material such as titanium (Ti) and molybdenum (Mo), for example, a stacked-layer structure of titanium (Ti) and aluminum (Al) and a stacked-layer structure of molybdenum (Mo) and aluminum (Al).

The layer 701 including a semiconductor element includes a semiconductor element such as a resistor and a capacitor in addition to a field effect transistor.

The interlayer insulating layer-811 is formed over the interlayer insulating layer 808 and the source wire and the drain wire 809a and 809b. The interlayer insulating layer 811 is formed similarly to the interlayer insulating layer 808. Moreover, over the interlayer insulating layer 808, connecting terminals 812 and 813 connected to the semiconductor element 802 are provided.

Moreover, an insulating layer 814 to cover portions of the connecting terminals 812 and 813 and the interlayer insulating layer 811 may be formed. The interlayer insulating layer 811 which functions as a protective layer is preferably formed of silicon nitride, silicon oxide, silicon nitride oxide, silicon oxynitride, DLC (Diamond-Like Carbon), or the like.

The conductive layers 702a and 702b which connect between the antenna 703 and the layer 701 including a semiconductor element are formed of a bump, a conductive paste, an anisotropic conductive adhesive, an-anisotropic conductive film, or the like. Further, a bump and a conductive paste may be used in combination. Furthermore, a bump and an anisotropic conductive adhesive, or a bump and an anisotropic conductive film may be used in combination. In these cases, a conductive layer and a connecting terminal are connected through the bump and the conductive particles.

An anisotropic conductive film and an anisotropic conductive adhesive are adhesive organic resins in which conductive particles having the particle size of about several nm to several μm are dispersed. An epoxy resin, a phenol resin, or the like can be given as an organic resin. Moreover, conductive particles are formed of one or a plurality of elements selected from gold, silver, copper, palladium, or platinum. Alternatively, a multi-layer structure of these elements may be employed as well. Further, conductive particles formed by coating resin particles with a thin film formed of one or a plurality of metals selected from gold, silver, copper, palladium, or platinum may be used as well.

An under-fill 704 has a function to reinforce the connecting portion between the layer 701 including a semiconductor element and the antenna 703 and protect it from the entering of moisture, and can be formed using an epoxy resin, an acrylic resin, a polyimide resin, or the like.

A wireless chip of the invention can also have a structure as shown in FIG; 7B.

Figure 7B:
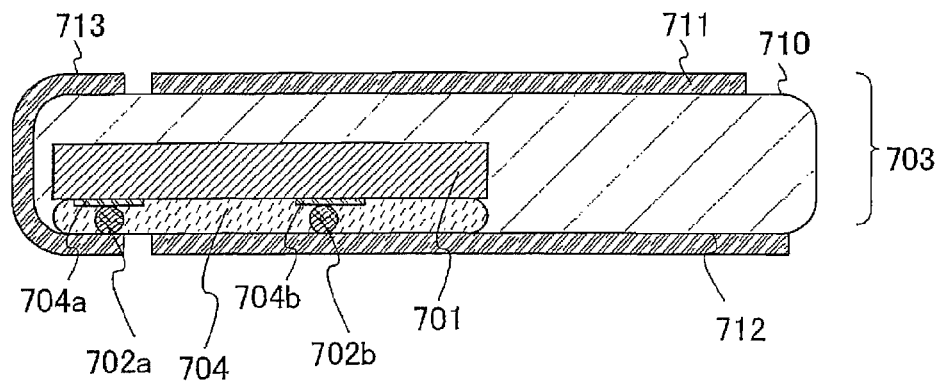

An antenna included in a wireless chip shown in-FIG 7B is formed by forming a hole for inserting the layer 701 including a semiconductor element after forming the dielectric layer 710. Then, the first conductive layer 711 is formed over a surface of the dielectric layer 710. The layer 701 including a semiconductor element is inserted and then the second conductive layer 712 and the power feeding layer 713 are formed.

Here, the power feeding layer 713 of the antenna and the connecting terminal 704a formed over a surface of the layer 701 including a semiconductor element are connected through the conductive layer 702a. The connecting terminal 704b formed over a surface of the layer 701 including a semiconductor element and the conductive layer 712 which functions as a ground of the antenna are connected through the conductive layer 702b. Moreover, a connecting portion between the antenna 703 and the layer 701 including a semiconductor element may be filled with the under-fill 704.

A wireless chip of the invention is not limited to be formed by the aforementioned method. However, as described above, by forming the layer 701 including a semiconductor element inside the dielectric layer 710 included in the antenna, a shape with only a flat surface and a curved surface without a projection and a depression can be obtained, thereby the safety can be improved.

According to the invention, a wireless chip which is small in size, favorable in communication property, and inexpensive can be provided. Further, a wireless chip of the invention has a cylindrical shape in which outer edge portions thereof have curved surfaces. In specific, corners at which a top surface, a bottom surface, and a side surface of the cylindrical shape intersect are rounded off by grinding, thereby a shape having only a flat surface and a curved surface is obtained. Besides, a shape with no corner may be obtained by forming a polygonal prism shape such as a quadratic prism and rounding off corners at which a top surface, a bottom surface, and side surfaces intersect and corners at which side surfaces intersect. Furthermore, a spherical shape, an ovoid shape, an oval spherical shape like a go stone, an oval spherical shape like a rugby ball, a disc shape, or the like may be obtained, thereby a wireless chip can be provided with high safety which does not cause an injury or the like when touched.

It is to be noted that this embodiment mode can be implemented in combination with the aforementioned embodiment mode.

[Embodiment Mode 3]

This embodiment mode describes steps of forming the semiconductor element in the layer including a semiconductor element described in Embodiment Modes 1 and 2 by using different materials. In this embodiment mode, a layer including a semiconductor element is formed by forming a semiconductor element having an organic semiconductor layer over an insulating substrate as an example.

For example, a flexible substrate has lower thermal resistance as compared to a non-flexible substrate such as a glass substrate. Therefore, in the case of forming a semiconductor element over a flexible substrate, it is preferable to use an organic semiconductor. The layer including a semiconductor element formed of an organic semiconductor is formed by forming a semiconductor element over a flexible substrate and an insulating layer to cover the semiconductor element. A connecting terminal to be connected to a wire of the semiconductor element is formed over the surface of the layer including the semiconductor element.

Figure 9A:
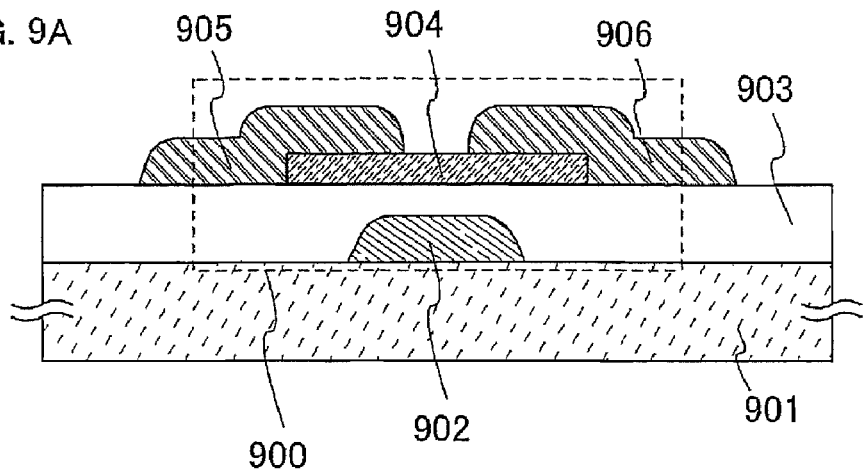
FIGS. 9A and 9B are sectional views of semiconductor elements which form a wireless chip of the invention.
Figure 9B:
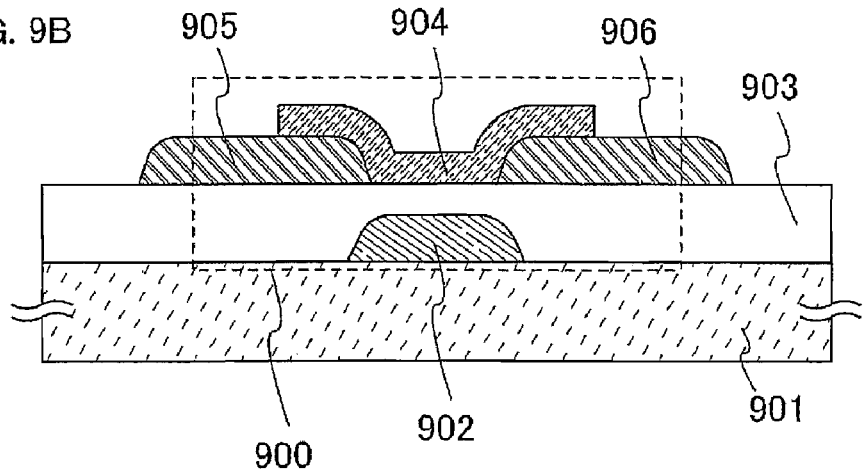

Here, description is made with reference to FIGS. 9A and 9B on structures of the semiconductor element formed of an organic semiconductor. FIG. 9A shows an example of using a staggered transistor. A semiconductor element 900 is provided over a flexible substrate 901. The semiconductor element 900 is formed of a gate electrode 902, an insulting layer 903 which functions as a gate insulating film, a semiconductor layer 904 which is overlapped with the gate electrode and the insulating layer which functions as a gate insulating film, and wires 905 and 906 connected to the semiconductor layer 904. It is to be noted that the semiconductor layer is in contact with the insulating layer 903 which functions as a gate insulating film and the wires 905 and 906.

The gate electrode 902 can be formed, for example, by a method to form a predetermined pattern by discharging liquid droplets of a composition containing fine particles from minute orifices (hereinafter referred to as a droplet discharge method in this specification) and to apply drying and baking treatment. Furthermore, the gate electrode 902 can be formed by printing a paste containing particles over a flexible substrate by a printing method and applying drying and baking treatment. As a typical example of the particles, particles containing any one of gold, copper, an alloy of gold and silver, an alloy of gold and copper, an alloy of silver and copper, and an alloy of gold, silver, and copper as a main component may be used. Further, particles containing conductive oxide such as indium tin oxide (ITO) as a main component may also be used.

The insulating layer 903 which functions as a gate insulating film can be formed by using a similar material and method to those of the gate insulating layer 405 described with reference to FIGS. 3A to 3D. However, in the case of forming the insulating layer by applying an insulating film material, which is dissolved in an organic solvent, by a spin coating method, a roll coating method, or the like and applying thermal treatment, it is preferable to perform the thermal treatment at a temperature lower than the heat resistance temperature of the flexible substrate.

The semiconductor layer 904 is formed of a polycyclic aromatic compound, a conjugated double bond compound, phthalocyanine, a charge-transfer complex, or the like. For example, anthracene, tetracene, pentacene, 6T (hexathiophene), TCNQ (tetracyanoquinodimethane), PTCDA (perylenetetracarboxylic dianhydride), NTCDA (naphthalenetetracarboxylic dianhydride), or the like can be used. As a specific example of an organic high molecular compound material, a π-conjugated hi h molecular compound, a carbon nanotube, polyvinyl pyridine, a phthalocyanine metal complex, or the like can be given. In particular, polyacetylene, polyaniline, polypyrrole, polythienylene, a polythiophene derivative, poly(3 alkylthiophene), a polyparaphenylene derivative, or a polyp araphenylene vinylene derivative can be employed, which is a π-conjugated high molecular compound whose skeleton is formed of conjugated double bonds.

Further, the organic semiconductor film may be formed by a method to form a film having a uniform film thickness. The film thickness is set to 1 to 1000 nm, and preferably 10 to 100 nm. As a specific method, an evaporation method, a spin coating method, a barcode method, a solution casting method, a dip coating method, a screen printing method, a roll coating method, or a droplet discharge method can be used.

The wires 905 and 906 can be formed using a similar material and method to those of the gate electrode 902.

FIG. 9B shows an example of using a coplanar transistor. The semiconductor element 900 is provided over the flexible substrate 901. In the semiconductor element 900, the gate electrode 902, the insulating layer 903 which functions as a gate insulating film, the wires 905 and 906, and the semiconductor layer 904 overlapped with the gate electrode and the insulating layer 903 which functions as a gate insulating film are formed. Further, the wires 905 and 906 are in contact with the insulating layer which functions as the gate insulating layer and the semiconductor layer.

By forming a semiconductor element using an organic semiconductor layer over a flexible substrate as described above, a very thin layer including a semiconductor element can be formed. By forming the antenna described in Embodiment Modes 1 and 2 and attaching the antenna and the layer including a semiconductor element as shown in FIG. 2D so as to be electrically connected (for example, by using an anisotropic conductive film, or the like), a wireless chip having a shape without projection and depression can be formed.

The invention can provide a wireless chip which is small in size, favorable in a communication property, and inexpensive. Further, a wireless chip of the invention has a cylindrical shape in which outer edge portions thereof have curved surfaces. In specific, corners at which a top surface, a bottom surface, and a side surface of the cylindrical shape intersect are rounded off by grinding, thereby a shape having only a flat surface and a curved surface is obtained. Besides, a shape with no corner may be obtained by forming a polygonal prism shape such as a quadratic prism and rounding off corners at which a top surface, a bottom surface, and side surfaces intersect and corners at which side surfaces intersect. Furthermore, a spherical shape, an ovoid shape, an oval spherical shape like a go stone, an oval spherical shape like a rugby ball, a disc shape, or the like may be obtained, thereby a wireless chip can be provided with high safety which does not cause an injury or the like when touched.

It is to be noted that this embodiment mode can be freely implemented in combination with the aforementioned embodiment modes.

[Embodiment Mode 4]

Figure 10A:
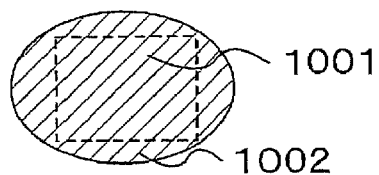
FIGS. 10A to 10C are diagrams showing wireless chips of the invention.
Figure 10B:
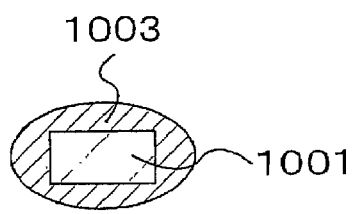
Figure 10C:
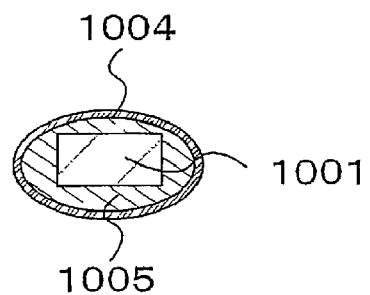

In this embodiment mode, description is made with reference to FIGS. 10A to 10C on a wireless chip coated with a resin or the like, which is a different mode than the aforementioned Embodiment Modes 1 to 3.

For example, in the case where a wireless chip having only a flat surface and/or a curved surface cannot be formed when the workability and the manufacturing cost of a dielectric layer are considered, a wireless chip formed into an unspecified shape can be coated with a protective layer such as a resin. FIG. 10A shows a wireless chip 1001 coated with a protective layer 1002 such as a resin.

By coating the wireless chip 1001 with the protective layer 1002 such as a resin, the wireless chip with an ovoid shape, a spherical shape, an oval spherical shape like a go stone, an oval spherical shape like a rugby ball, a disc shape, or the like can be formed. Alternatively, a wireless chip having a cylindrical shape (or a polygonal prism shape) in which outer edge portions thereof has curved surfaces can be formed by using a casting mold or rounding off corners by grinding.

In a wireless chip of the invention which wirelessly communicates with a reader/writer through electromagnetic waves, a wireless tag can be coated with a protective layer formed of a substance which does not interrupt the communication.

FIGS. 10B and 10C show sectional views of wireless chips each coated with a protective layer such as a resin. As shown in FIG. 10B, the wireless chip 1001 can be directly coated with a protective layer 1003 such as a resin. Furthermore, as shown in FIG. 10C, a protective layer 1004 is formed into a capsule and the wireless chip 1001 is incorporated therein, and a filler material 1005 may be provided between the protective layer 1004 and the wireless chip 1001.

As an example of a protective layer to coat a wireless chip, an organic resin, an inorganic resin, diamond-like carbon (DLC), and the like can be given. Further, when the protective layer contains silicon nitride, silicon oxide, silicon nitride oxide, silicon oxynitride, carbon nitride, or the like, the layer including a semiconductor element can be protected from an alkali metal which degrades the function of the semiconductor.

The method to form the outer shape by coating the wireless tag as described above can be applied to the case where the shape of the wireless tag cannot be determined only by the dielectric layer since the layer including a semiconductor element formed of a silicon wafer is thick and the case where it costs rather less to coat the wireless tag than shaping the dielectric layer.

Moreover, by coating the outermost surface of a wireless chip with a resin, DLC (Diamond-Like Carbon), or the like to shape the chip into a shape with a curved surface as described in the invention, a wireless chip with high safety which does not harm a human body even when the wireless chip is drunk by mistake Further, by coating the outermost surface of a wireless chip, physical strength can be enhanced and a recyclable wireless chip which can be used repeatedly can be provided.

It is to be noted that this embodiment mode can be freely implemented in combination with the aforementioned embodiment modes.

[Embodiment Mode 5]

Figure 11A:
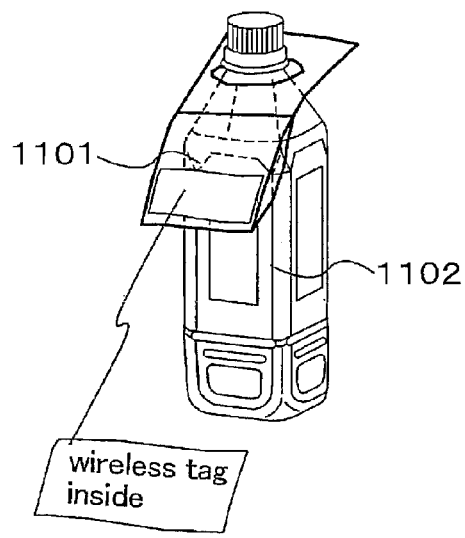
FIGS. 11A to 11C are views showing uses of a wireless chip of the invention.
Figure 11B:
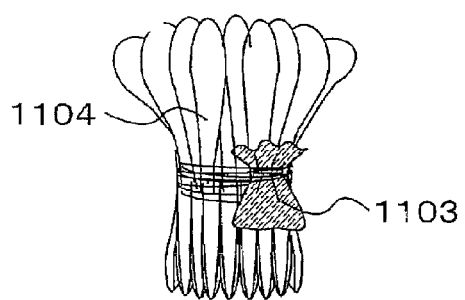
Figure 11C:
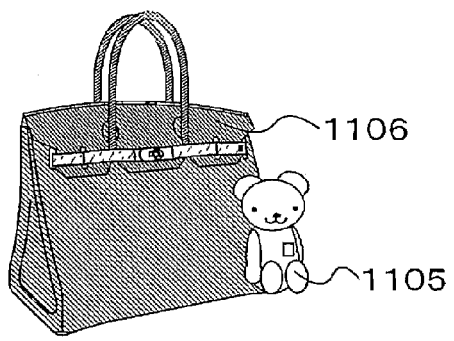

In this embodiment mode, description is made with reference to FIGS. 11A to 11C on applications of a wireless chip.

A wireless chip which is small in size and can be inexpensively manufactured can be attached to an object to manage the retail thereof. In this manner, when a large number of wireless chips are used for the retailing of objects, the wireless chip ultimately reaches a consumer. The ultimate consumers are general public including people who have no knowledge about the wireless chip and the automatic recognition technique. Therefore, for example, there is a risk of an unexpected accident such as injuring a skin or drinking by mistake. Moreover, there is a problem in the disposal method and recycling of the wireless chip after use.

In view of these problems, the invention provides a method to wrap or incorporate a wireless chip in a box, a bag, wrapping paper, a free gift, or the like with a safe size and shape that the consumers can easily recognize, and attach it to an object, thereby managing the objects using the wireless chip.

For example, as shown in FIG. 11A, a wireless chip can be put in a bag 1101 and attached to an object 1102 such as a plastic bottle. By putting a wireless chip in a bag having a hook as shown in the drawing, a retailer can attach the wireless chip easily to a product. Furthermore, the bag has a size which can be recognized at a glance, therefore, a product without a wireless chip can be recognized at a glance as well. Moreover, a consumer can also recognize the presence of the wireless chip.

Further, as shown in FIG. 11B, a wireless chip can be wrapped in wrapping paper 1103 and attached to an object 1104 such as a vegetable. By wrapping a wireless chip as shown in the drawing, the wireless chip can be easily attached when bundling the products such as vegetables. Moreover, when a consumer cooks the vegetables, the wireless chip can be securely taken off before cooking.

Furthermore, as shown in FIG. 11C, a wireless chip can be incorporated in a free gift 1105 or the like and then attached to an object 1106, for example, in the case of selling an expensive bag or the like. By incorporating a wireless chip in a pretty mascot as shown in the drawing, the image of the product may be improved. Further, a wireless chip incorporated in the mascot is treated well, therefore, the wireless chip may be able to be recycled.

By using a wireless chip as described above, a retailer who uses the wireless chip and a consumer who buys the product can recognize the wireless chip as it is. Moreover, by using a safe material for the outermost surface of an object to wrap or incorporate the wireless chip, an unexpected accident can be avoided. Further, wastes with wireless chips can be sorted to be collected.

Further, the wrapping paper, bag, and the like which incorporate the wireless tags can be easily collected in the retail shop, therefore, the wireless chips can be recycled. Wrapping or incorporating the wireless chip can prevent the wireless chip from deteriorating. Furthermore, by changing the object which wraps or incorporates the wireless chip, the wireless chip can be recycled.

It is to be noted that this embodiment mode can be freely implemented in combination with the aforementioned embodiment modes.

[Embodiment Mode 6]

In this embodiment mode, description is made with reference to FIGS. 12A to 12D on the kinds of an antenna which forms a wireless chip of the invention.

First, dielectric layers 1201, 1211, 1221, and 1241 as shown in FIGS. 12A to 12D are formed. The aforementioned dielectric layer has a cylindrical shape with outer edge portions having curved surfaces. In specific, the aforementioned dielectric layer has a cylindrical shape and a curved surface in an outer edge portion. In specific, corners at which a top surface, a bottom surface, and a side surface of the cylindrical shape intersect are rounded off by grinding, thereby a shape having only a flat surface and a curved surface is obtained. Besides, a shape with no corner may be obtained by forming a polygonal prism shape such as a quadratic prism and rounding off corners at which a top surface, a bottom surface, and side surfaces intersect and corners at which side surfaces intersect. Furthermore, a spherical shape, an ovoid shape (FIG. 23D), an oval spherical shape like a go stone, an oval spherical shape like a rugby ball, a disc shape, or the like may be obtained. In each of FIGS. 12A to 12D, a dielectric layer formed in a cylindrical shape and then its corners are removed by rounding is shown as an example. However, the invention is not limited to this.

Figure 12A:
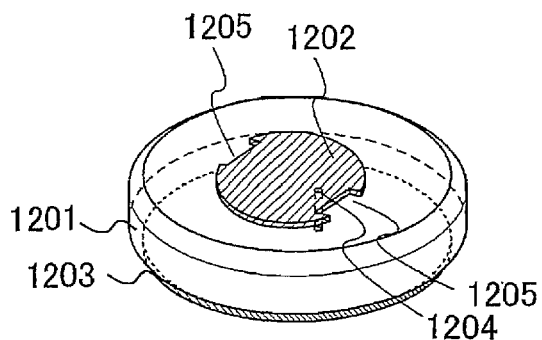
FIGS. 12A to 12D are views showing antennas which form a wireless chip of the invention.

First, an antenna shown in FIG. 12A includes a first conductive layer 1202 which functions as an emitter electrode, a dielectric layer 1201, a second conductive layer 1203 which functions as a ground, a power feeding point 1204, and a power feeder which is formed in a through hole provided in the first conductive layer, the dielectric layer, and the second conductive layer and connected to the power feeding point. It is to be noted that the power feeder is connected to the first conductive layer at the power feeding point but not connected to the second conductive layer. By forming the first conductive layer 1202 which functions as an emitter electrode into a circular shape and rounding off two regions 1205 which are symmetric with respect to a point, the antenna can receive circularly polarized electromagnetic waves. Further, in the case where the first conductive layer 1202 is in a rectangular shape, the antenna can receive vertically polarized electromagnetic waves.

Figure 12B:
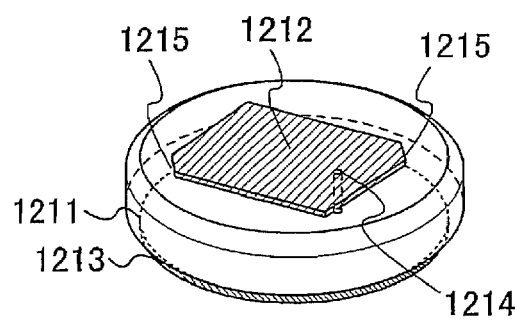

Next, an antenna shown in FIG. 12B includes a first conductive layer 1212 which functions as an emitter electrode, a dielectric layer 1211, a second conductive layer 1213 which functions as a ground, a power feeding point 1214, and a power feeder which is formed in a through hole provided in the first conductive layer, the dielectric layer, and the second conductive layer, and connected to the power feeding point. It is to be noted that the power feeder is connected to the first conductive layer at the power feeding point but not connected to the second conductive layer. By forming the first conductive layer 1212 which functions as an emitter electrode into a rectangular shape and rounding off two corners 1215 which are symmetric with respect to a point, the antenna can receive circularly polarized electromagnetic waves. Further, in the case where the first conductive layer 1212 is in a rectangular shape, the antenna becomes an antenna for vertically polarized waves.

Figure 12C:
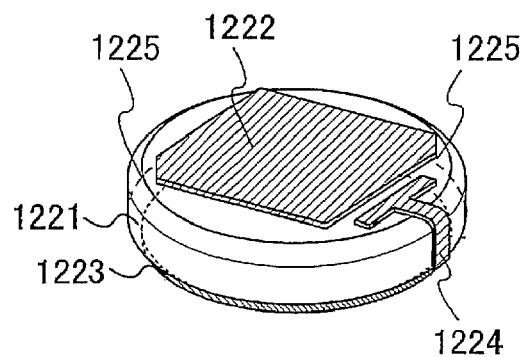

Further, an antenna shown in FIG. 12C includes a first conductive layer 1222 which functions as an emitter electrode, a dielectric layer 1221, a second conductive layer 1223 which functions as a ground, and a power feeding layer 1224. By forming the first conductive layer 1222 which functions as an emitter electrode into a rectangular shape and rounding off two corners 1225 which are symmetric with respect to a point, the antenna can receive circularly polarized electromagnetic waves. The power feeding layer 1224 and the first conductive layer 1222 which functions as an emitter electrode are capacitively coupled through a gap. Moreover, the power feeding layer 1224 can be formed over the side surface of the dielectric layer and thus mounted on the surface.

Each of the antennas shown in FIGS. 12A to 12C has the second conductive layer which functions as a ground over one surface of the dielectric layer, therefore, the first conductive layer side has directivity, to which electromagnetic waves are emitted.

Figure 12D:
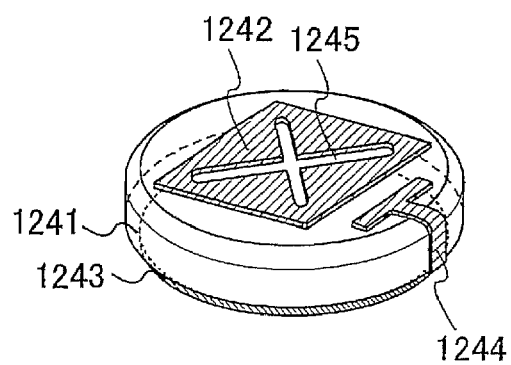

Moreover, an antenna shown in FIG. 12D includes a first conductive layer 1242 which functions as an emitter electrode, a dielectric layer 1241, a second conductive layer 1243 which functions as a ground, and a power feeding layer 1244. Further, orthogonal slits 1245 are diagonally formed in the first conductive layer 1242. That is, a cross slit is provided. Therefore, the dielectric layer 1241 is exposed in a cross shape. The first conductive layer 1242 which functions as an emitter electrode and the power feeding layer 1244 are capacitively coupled through a gap.

In particular, by using an antenna for circularly polarized waves, satellite communication such as GPS (Global Positioning System) (1.5 GHz) and satellite digital broadcasting (2.6 GHz), PAN (Personal Area Network) communication such as wireless LAN (Local Area Network) (2.4 GHz, 5.2 GHz), wireless communication for portable information devices (2.4 GHz), UWB (Ultra Wide Band) (3 to 10 GHz), data communication of third generation, and packet communication can be carried out.

Moreover, a wireless chip of the invention can be formed by using a known antenna as well as the antennas shown in FIGS. 12A to 12D.

It is to be noted that this embodiment mode can be freely implemented in combination with the aforementioned embodiment modes.

[Embodiment Mode 7]

Figure 13A:
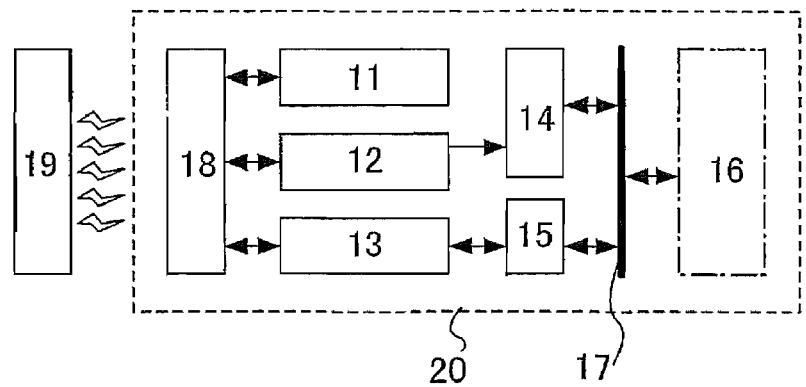
FIGS. 13A to 13C are block diagrams showing circuit configurations of a wireless chip of the invention.
Figure 13B:
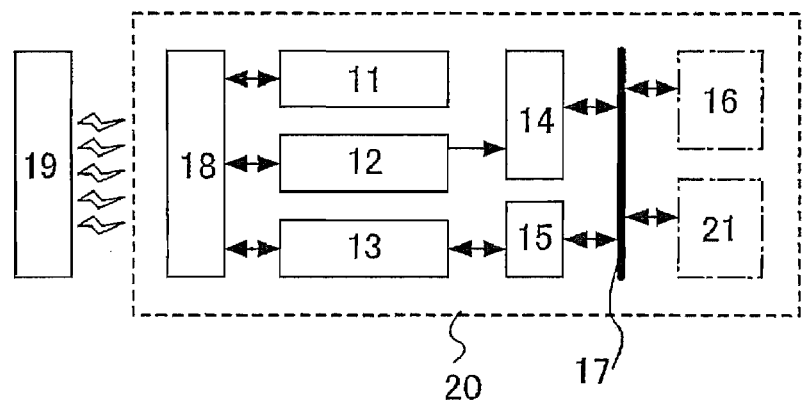
Figure 13C:
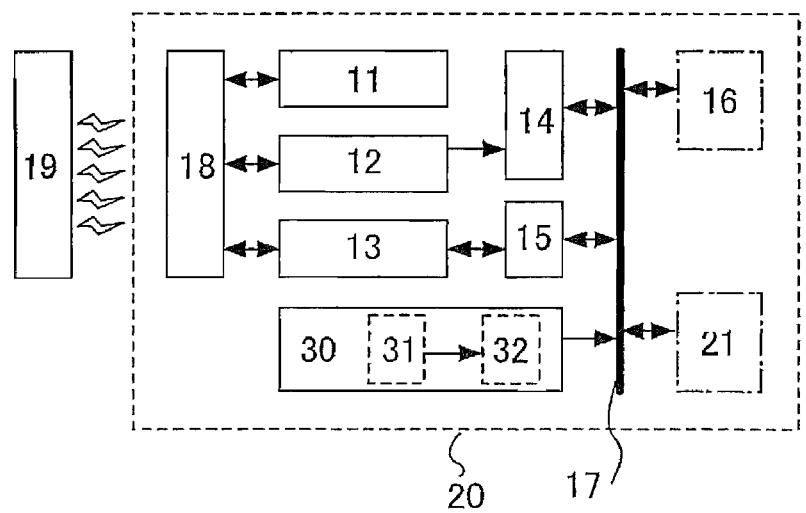

In this embodiment mode, description is made with reference to FIGS. 13A to 13C on circuit configuration examples of wireless chips of the invention.

A wireless chip 20 of the invention wirelessly communicates with a reader/writer. The wireless chip 20 includes a power source circuit 11, a clock generating circuit 12, a data demodulation/modulation circuit 13, a control circuit 14 which controls another circuit, an interface circuit 15, a memory circuit 16, a bus 17, and an antenna 18 as shown in FIG. 13A.

Moreover, as shown in FIG. 13B, the wireless chip 20 of the invention may include a central processing unit 21 in addition to the power source circuit 11, the clock generating circuit 12, the data demodulation/modulation circuit 13, the control circuit 14 which controls another circuit, the interface circuit 15, the memory circuit 16, the bus 17, and the antenna 18.

Further, as shown in FIG. 13C, the wireless chip 20 of the invention may include a detection portion 30 formed of a detecting element 31 and a detecting circuit 32 in addition to the power source circuit 11, the clock generating circuit 12, the data demodulation/modulation circuit 13, the control circuit 14 which controls another circuit, the interface circuit 15, the memory circuit 16, the bus 17, the antenna 18, and the central processing unit 21. Here, the central processing unit 21 includes a CPU, an arithmetic processing circuit, or the like. The detecting element 31 includes a sensor for measuring the amount, concentration, and the like of a substance.

A small and multifunctional wireless chip can be formed by forming the detection portion 30 formed of the detecting element 31 and the detecting circuit 32, or the like in addition to the power source circuit 11, the clock generating circuit 12, the data demodulation/modulation circuit 13, the control circuit 14 which controls another circuit, the interface circuit 15, the memory circuit 16, the bus 17, the central processing unit 21 in the layer including a semiconductor element described in Embodiment Modes 1 to 3.

The power source circuit 11 generates various power sources to be supplied to each circuit in the wireless chip 20 based on alternating signals inputted from the antenna 18. The clock generating circuit 12 generates various clock signals to be supplied to each circuit in the wireless chip 20 based on alternating signals inputted from the antenna 18. The data demodulation/modulation circuit 13 has a function to demodulate/modulate data to communicate with the reader/writer 19. The control circuit 14 which controls another circuit has a function to control the memory circuit 16. The antenna 18 has a function to transmit/receive electromagnetic waves. The reader/writer 19 controls a process related to the communication, control, and data of the wireless chip. It is to be noted that the wireless chip is not limited to have the aforementioned structure and may have a structure where another element such as a limiter circuit for a power source voltage and dedicated cryptographic hardware is additionally provided.

The memory circuit 16 includes one or a plurality selected from a DRAM, an SRAM, a FeRAM, a mask ROM, a PROM, an EPROM, an EEPROM, a flash memory, and an organic memory.

It is to be noted that an organic memory includes a pair of electrodes which sandwich a layer containing an organic compound. Further, an organic memory includes a mixed layer of an organic compound and an inorganic compound between a pair of electrodes. As a typical example of an organic compound, a substance of which crystallinity, conductivity, or shape changes by an electrical effect or light irradiation is used. As a typical substance, conjugated polymer to which a compound which generates acid by absorbing light (photoacid generator) is doped, an organic compound having a high hole transporting property, or an organic compound having a high electron transporting property can be used.

Moreover, in the case of providing a mixed layer of an organic compound and an inorganic compound between a pair of electrodes, an organic compound having a high hole transporting property and an inorganic compound which easily accepts electrons are preferably mixed. Further, it is preferable to mix an organic compound having a high electron transporting property and an inorganic compound which easily gives electrons. With such a structure, a lot of hole carriers and electron carriers are generated in an organic compound which does not originally have almost any internal carriers, thereby excellent hole injecting and transporting properties and electron injecting and transporting properties can be obtained.

An organic memory can realize the reduction in size and film thickness, and large capacity at the same time, therefore, a wireless chip can be formed small and light in weight by providing an organic memory as the memory circuit 16.

It is to be noted that this embodiment mode can be freely implemented in combination with the aforementioned embodiment modes.

[Embodiment Mode 8]

Figure 14:
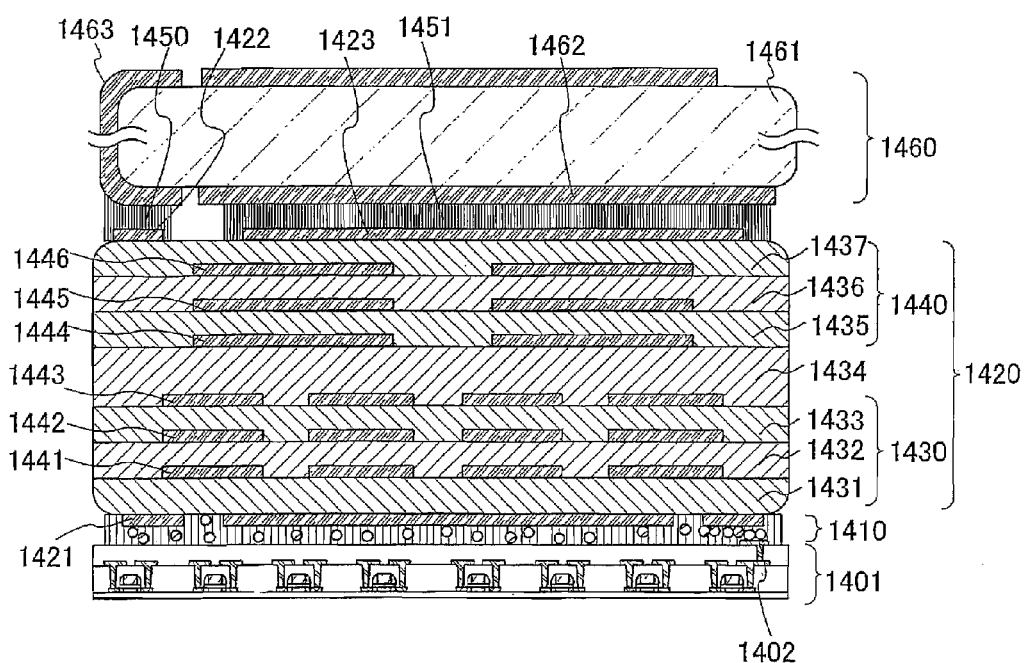
FIG. 14 is a sectional view of a wireless chip of the invention.

FIG. 14 shows an embodiment mode of a wireless chip of the invention. FIG. 14 is a sectional view of a wireless chip. In this embodiment mode, description is made on a structure of a wireless chip where a layer including a semiconductor element, a passive element, and an antenna are fixed by an anisotropic conductive adhesive, a conductive layer, or the like.

As described in Embodiment Modes 1 to 3, a layer 1401 including a semiconductor element is formed. The layer 1401 including a semiconductor element and a passive element 1420 are fixed by an anisotropic conductive adhesive 1410. Here, the passive element 1420 is shown to be formed of a first passive element 1430 and a second passive element 1440. Moreover, a wire 1402 exposed to a surface of the layer 1401 including a semiconductor element and a first wire 1421 of the passive element 1420 are electrically connected through conductive particles in the anisotropic conductive adhesive 1410.

Further, the passive element 1420 and the antenna 1460 are fixed by conductive layers 1450 and 1451. A power feeding layer 1463 of the antenna 1460 and a second wire 1422 of the passive element 1420, and a second conductive layer 1462 which functions as a ground of the antenna and a third wire 1423 are electrically connected through conductive layers 1450 and 1451 respectively. The conductive layers 1450 and 1451 are formed by curing conductive paste. As a typical example of a conductive layer formed by curing conductive paste, an alloy containing a plurality of tin (Sn), silver (Ag), bismuth (Bi), copper (Cu), indium (In), nickel (Ni), antimony (Sb), and zinc (Zn) is used. Moreover, an anisotropic conductive adhesive can also be used instead of the conductive layers 1450 and 1451.

Further, the first passive element 1430 includes insulating layers 1431 to 1434 and conductive layers 1441 to 1443 provided between them, which form one or more of a capacitor, an inductor, and a resistor. The second passive element 1440 similarly includes insulating layers 1434 to 1437 and conductive layers 1444 to 1446 provided between them, which form one or more of a capacitor, an inductor, and a resistor.

It is preferable that the dielectric constants of the insulating layers 1431 to 1437 of the first passive element 1430 or the second passive element 1440 be 2.6 to 40. The conductive layers 1441 to 1446 are formed of a metal having high conductivity such as gold, silver, copper, and aluminum or an alloy formed of a plurality of them.

The first passive element 1430 and the second passive element 1440 are formed as follows. A conductive layer is formed by printing a metal having high conductivity such as gold, silver, copper, and aluminum or an alloy formed of a plurality of them by a printing method over a sheet (what is called a green sheet) with a thickness of 10 to 150 μm formed of ceramic containing aluminum oxide and silicon oxide. It is to be noted that a through hole may be formed in the green sheet and conductive paste may be filled in the through hole to form a plug if required. Moreover, the green sheet may be formed by appropriately mixing ceramic, an organic resin, and the like which form the dielectric layer 1461 of the antenna 1460 described in Embodiment Mode 1 or 2. The first passive element 1430 and the second passive element 1440 can be formed by thermocompression bonding of a plurality of green sheets over which such conductive layers are printed, processing them into a predetermined size, and baking them by heat at 800 to 1300° C. to form the insulating layer and the conductive layer.

When a plurality of passive elements such as a capacitor, an inductor, a resistor, and a wire are used in combination, a front end module including a diplexer, and a low pass filter which constitute a high frequency circuit, an isolator power amplifier module including an isolator, a coupler, an attenuator, and a power amplifier, a VCO (voltage control oscillator), a band pass filter (BPF), a stacked-layer filter, a balun transformer, a dielectric filter, a coupler, a resonator, and the like can be formed. Here, a high frequency circuit is a circuit which operates with a frequency of several hundreds MHz to several tens GHz.

Further, a passive element and a layer including a semiconductor element form a power source circuit, a clock generating circuit, and a data demodulation/modulation circuit as high frequency circuits, a control circuit which controls another circuit, an interface circuit, a memory circuit, a central processing unit, a detecting element and a detecting control circuit, and the like.

Moreover, similarly to Embodiment Mode 1, the layer 1401 including a semiconductor element may be fixed to a flexible substrate through an organic resin layer.

A wireless chip of this embodiment mode is formed of an integrated circuit formed by using a semiconductor element and a passive element formed by stacking an insulating layer and a conductive film. Therefore, each circuit is highly integrated by elements with appropriate functions. By mounting a wireless chip of the invention to a wiring substrate, the number of components can be reduced, which can reduce the area of the wiring substrate and downsize an electronic device having the wiring substrate.

It is to be noted that this embodiment mode can be freely implemented in combination with the aforementioned embodiment modes.

[Embodiment]

In this embodiment, description is made on a method for forming a semiconductor element as an example.

Figure 15A:
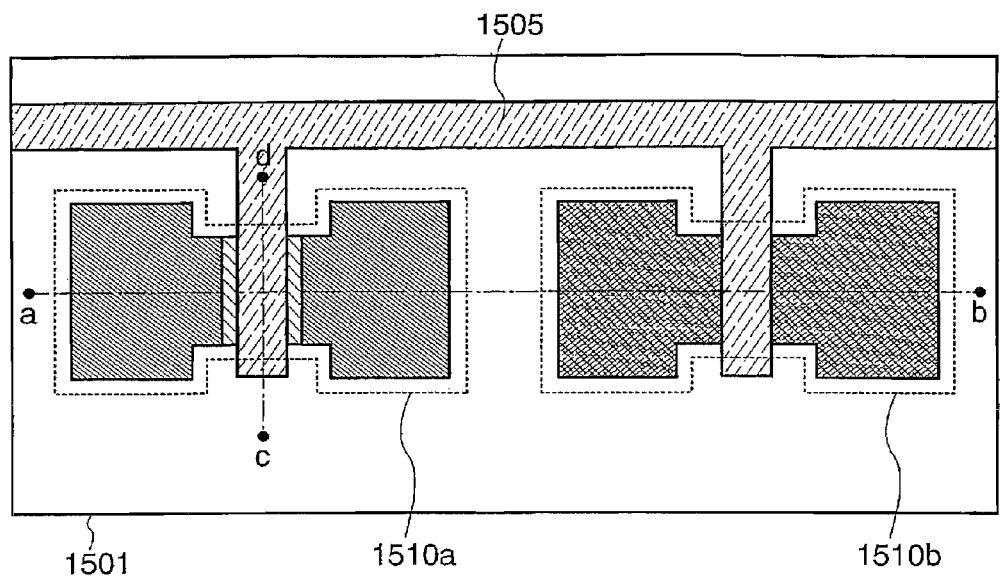
FIGS. 15A is a top plan view and FIGS. 15B and 15C are sectional views of semiconductor elements which form a wireless chip.
Figure 15B:
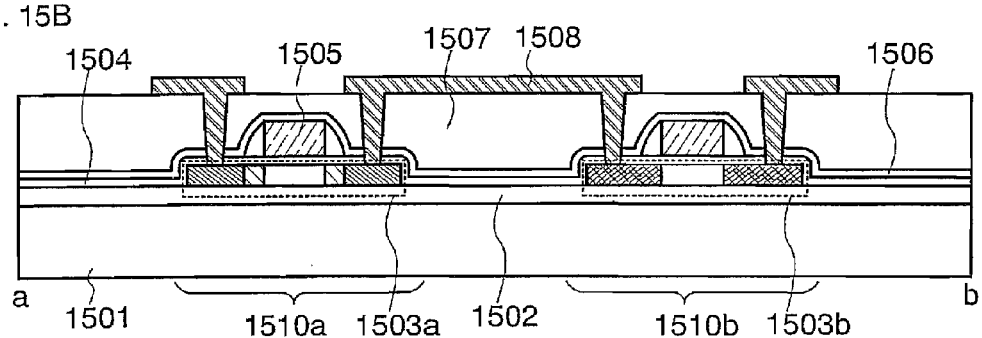
Figure 15C:
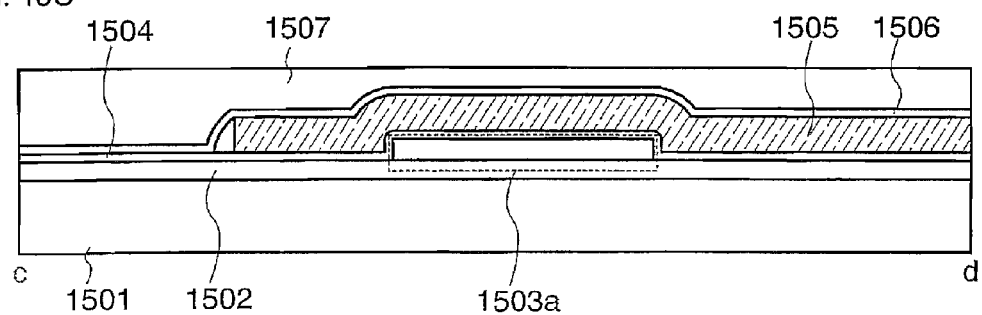

FIGS. 15A to 15C show examples of a layer including a semiconductor element which forms a wireless chip of the invention. It is to be noted in FIGS. 15A to 15C that FIG. 15B corresponds to a cross sectional view along a-b in FIG. 15A and FIG. 15C corresponds to a sectional view along c-d in FIG. 15A.

The layer including a semiconductor element shown in FIGS. 15A to 15C includes semiconductor films 1503a and 1503b provided over a substrate 1501 with an insulating film 1502 interposed therebetween, a gate electrode 1505 provided over the semiconductor films 1503a and 1503b with a gate insulating film 1504 interposed therebetween, insulating films 1506 and 1507 provided so as to cover the gate electrode, and a conductive film 1508 which is electrically connected to a source region or a drain region of the semiconductor films 1503a and 1503b and provided over the insulating film 1507. It is to be noted in FIGS. 15A to 15C that an n-type thin film transistor 1510a of which channel region is a portion of the semiconductor film 1503a and a p-channel thin film transistor 1510b of which channel region is a portion of the semiconductor film 1503b are provided, however, the invention is not limited to this configuration. For example, in FIGS. 15A to 15C, an LDD region is provided in the n-type thin film transistor 1510a but not in the p-type thin film transistor 1510b, however, it can be provided in both of the transistors or no transistors.

The substrate 1501 may be formed of a glass substrate such as barium borosilicate glass and alumino borosilicate glass, a quartz substrate, a ceramic substrate, a metal substrate including stainless steel, or the like. Besides, a substrate containing a flexible synthetic resin such as plastic or acrylic represented by polyethylene terephthalate (PET), polyethylene naphthalate (PEN), or polyether sulfone (PES) can also be used. By using a flexible substrate, a layer having a semiconductor element which can be bent can be formed. In addition, as such a substrate has no limit in its area and size, for example, a rectangular substrate having a side of 1 meter or longer can be used as the substrate 1501, thereby the productivity can be drastically improved. Such an advantage is a big dominance as compared to the case to use a circular silicon substrate.

The insulating film 1502 functions as a base film and prevents an alkali metal such as Na and alkaline earth metal from dispersing into the semiconductor films 1503a and 1503b and affecting the characteristics of the semiconductor element. As the insulating film 1502, a single layer structure of an insulating film containing oxygen or nitrogen, such as silicon oxide ($SiO_x$), silicon nitride ($SiN_x$), silicon oxynitride ($SiO_xN_y$) (x>y), silicon nitride oxide ($SiN_xO_y$) (x>y), or the like or a stacked-layer structure of these. For example, in the case of providing the insulating film 1502 as a two-layer structure, it is preferable that a silicon nitride oxide film be provided as a first layer insulating film and a silicon oxynitride film be provided as a second layer insulating film. Further, in the case of providing the insulating film 1502 as a three-layer structure, it is preferable that a silicon oxynitride film be provided as a first layer insulating film, a silicon nitride oxide film be provided as a second layer insulating film, and a silicon oxynitride film be provided as a third layer insulating film.

The semiconductor films 1503a and 1503b can be formed of an amorphous semiconductor or a semi-amorphous semiconductor (SAS). In addition, a polycrystal semiconductor film may also be used. An SAS has an intermediate structure between amorphous and crystalline structures (including single crystal and poly crystal structures) and a tertiary state which is stable in terms of free energy, and including a crystalline region having a short distance order and lattice distortion (also referred to as a microcrystal semiconductor film) can be used as the active layer of the TFT. In the semi-amorphous semiconductor film, a crystal region having a grain diameter of 0.5 to 20 nm is included in at least one region of the film. In the case where an SAS contains silicon as a major component, the Raman spectrum shifts to the lower side of a wave number of 520 cm$^{-1}$. In addition, in the semi-amorphous semiconductor film, diffraction peaks of (111) and (220) derived from a Si crystal lattice are observed in x-ray diffraction. The semi-amorphous semiconductor film includes hydrogen or halogen at least 1 atom % for terminating a dangling bond. An SAS is formed by performing glow discharging decomposition (plasma CVD) of a silicide gas. As the silicide gas, SiH$_4$ as well as Si$_2$H$_6$, SiH$_2$Cl$_2$, SiHCl$_3$, SiCl$_4$, SiF$_4$, or the like can be used. Moreover, GeF$_4$ may be mixed as well. The silicide gas may be diluted with H$_2$, or H$_2$ and one or more of rare gas elements selected from He, Ar, Kr, and Ne. A dilution ratio is within the range of 2 to 1000 times. Pressure is roughly within the range of 0.1 to 133 Pa; power frequency is 1 to 120 MHz, preferably 13 to 60 MHz; and a substrate heating temperature is 300° C. or lower. The impurities of atmospheric components such as oxygen, nitrogen or carbon as an impurity element within a film is preferably at most 1×10$^{20}$ cm$^{-1}$, in particular, oxygen concentration is at most 5×10$^{19}$ /cm$^3$, preferably, at most 1×10$^{19}$ /cm$^3$. Here, a known method (a sputtering method, an LPCVD method, a plasma CVD method, or the like) is used to form an amorphous semiconductor film with a material containing silicon (Si) as a main component (for example, Si$_x$Ge$_{1-x}$ or the like), and then the amorphous semiconductor film is crystallized by a known crystallization method such as a laser crystallization method, a thermal crystallization method using RTA or an annealing furnace, and a thermal crystallization method using a metal element.

The gate insulating film 1504 can be formed of a single layer structure of an insulating film containing oxygen or nitrogen, such as silicon oxide (SiO$_x$), silicon nitride (SiN$_x$), silicon oxynitride (SiO$_x$N$_y$) (x>y), and silicon nitride oxide (SiN$_x$O$_y$) (x>y), or a stacked-layer structure of these.

The insulating film 1506 can be formed of a single layer structure of an insulating film containing oxygen or nitrogen, such as silicon oxide (SiO$_x$), silicon nitride (SiN$_x$), silicon oxynitride (SiO$_x$N$_y$) (x>y), and silicon nitride oxide (SiN$_x$O$_y$) (x>y) or a film containing carbon such as DLC (Diamond-Like Carbon), or a stacked-layer structure of these.

The insulating film 1507 can be formed of a single layer structure or a stacked-layer structure of an organic material such as epoxy, polyimide, polyamide, polyvinyl phenol, benzocyclobutene, and acrylic, or a siloxane resin, as well as an insulating film containing oxygen or nitrogen, such as silicon oxide (SiO$_x$), silicon nitride (SiN$_x$), silicon oxynitride (SiO$_x$N$_y$) (x>y), and silicon nitride oxide (SiN$_x$O$_y$) (x>y) or a film containing carbon such as DLC (Diamond-Like Carbon). It is to be noted that a siloxane material corresponds to a resin containing a Si—O—Si bond. Siloxane has a skeleton of a bond of silicon (Si) and oxygen (O). As a substituent, an organic group containing at least hydrogen (for example, an alkyl group and an aromatic carbon hydride) or a fluoro group may be used. Alternatively, an organic group containing at least hydrogen and a fluoro group may be used as a substituent. It is to be noted that the insulating film 1507 may be directly provided to cover the gate electrode 1505 without providing the insulating film 1506 in the layer including a semiconductor element shown in FIGS. 15A to 15C.

The conductive film 1508 can be formed of a single layer structure or a stacked-layer structure of one element selected from Al, Ni, C, W, Mo, Ti, Pt, Cu, Ta, Au, and Mn or an alloy containing a plurality of these elements. For example, an Al alloy containing C and Ti, an Al alloy containing Ni, an Al alloy containing C and Ni, an Al alloy containing C and Mn, and the like can be used as a conductive film formed of an alloy containing a plurality of the aforementioned elements. Further, in the case of forming the conductive film 1508 as a stacked-layer structure, Al and Ti can be stacked.

In FIGS. 15A to 15C, the n-type thin film transistor 1510a has sidewalls in contact with the side surfaces of the gate electrode 1505, a source region and a drain region formed by selectively adding impurities which impart n-type conductivity to the semiconductor film 1503a, and LDD regions provided beneath the sidewalls. Moreover, the p-type thin film transistor 1510b has sidewalls in contact with side surfaces of the gate electrode 1505, and a source region and a drain region formed by selectively adding impurities which impart p-type conductivity to the semiconductor film 1503b.

It is to be noted that in the layer including a semiconductor element which constitutes the wireless chip of the invention, at least one of the substrate 1501, the insulating film 1502, the semiconductor films 1503a and 1503b, the gate insulating film 1504, the insulating film 1506, or the insulating film 1507 is oxidized or nitrided by plasma treatment, thereby the semiconductor film or the insulating film is oxidized or nitrided. In this manner, by oxidizing or nitriding the semiconductor film or the insulating film by plasma treatment, the property of the surface of the semiconductor film or the insulating film is changed. As a result, a more dense insulating film can be formed as compared to an insulating film formed by a CVD method or a sputtering method. Therefore, a defect such as a pinhole can be suppressed and the characteristics or the like of the layer including a semiconductor element can be improved.

Hereinafter described with reference to the drawings is a method for forming a layer including a semiconductor element by plasma treatment. In specific, description is made on the case of forming a layer including a semiconductor element by oxidizing or nitriding the substrate 1501, the insulating film 1502, the semiconductor films 1503a and 1503b, the gate insulating film 1504, the insulating film 1506, or the insulating film 1507.

Here, description is made with reference to the drawings on a method for forming a layer including a semiconductor element by applying plasma treatment to the semiconductor films 1503a and 1503b or the gate insulating film 1504 in FIGS. 15A to 15C to oxidize or nitride the semiconductor films 1503a and 1503b or the gate insulating film 1504.

First, the edge portions of an island-shaped semiconductor film provided over a substrate are formed almost vertically.

Figures 1, 17A:
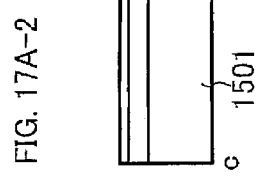
FIGS. 17A to 17C are sectional views showing manufacturing steps of semiconductor elements which form a wireless chip.
Figures 2, 17A:
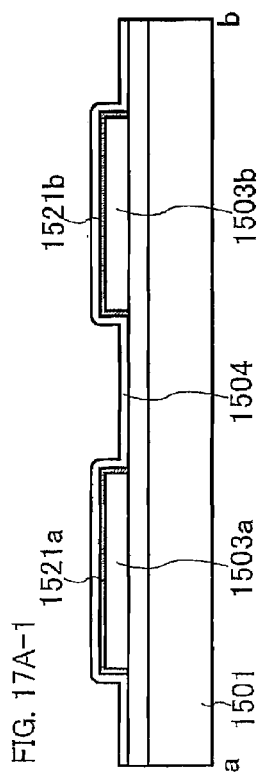

The island-shaped semiconductor films 1503a and 1503b are formed over the substrate 1501 (FIGS. 16A-1 and 16A-2). The island-shaped semiconductor films 1503a and 1503b are formed by forming an amorphous semiconductor film using a material containing silicon (Si) as a main component (for example, Si$_x$Ge$_{1-x}$ or the like) or the like by a known method (a sputtering method, an LPCVD method, a plasma CVD method, or the like) over the insulating film 1502 which is formed in advance over the substrate 1501, and then the amorphous semiconductor film is crystallized and selectively etched. It is to be noted that the amorphous semiconductor film can be crystallized by a known crystallization method such as a laser crystallization method, a thermal crystallization method using RTA or an annealing furnace, a thermal crystallization method using a metal element which promotes crystallization, or a method using these methods in combination. It is to be noted in FIGS. 16A to 16D that the edge portions of the island-shaped semiconductor films 1503*a* and 1503*b* are formed almost vertically (θ=85 to 100° C.).

Next, the semiconductor films 1503*a* and 1503*b* are oxidized or nitrided by plasma treatment to form oxide films or nitride films 1521*a* and 1521*b* (hereinafter also referred to as insulating films 1521*a* and 1521*b*) over the surfaces of the semiconductor films 1503*a* and 1503*b* respectively (FIGS. 16B-1 and 16B-2). In the case of using Si for the semiconductor films 1503*a* and 1503*b*, for example, silicon oxide ($SiO_x$) or silicon nitride ($SiN_x$) is formed as the insulating films 1521*a* and 1521*b*. Moreover, after the semiconductor films 1503*a* and 1503*b* are oxidized by plasma treatment, they may be nitrided by plasma treatment again. In this case, silicon oxide ($SiO_x$) is formed in contact with the semiconductor films 1503*a* and 1503*b* and silicon nitride oxide ($SiN_xO_y$) (x>y) is formed over the surface of the silicon oxide. It is to be noted that the semiconductor film is oxidized by plasma treatment in an oxygen atmosphere (for example, an atmosphere containing oxygen ($O_2$) and a rare gas (at least one of He, Ne, Ar, Kr, and Xe) or an atmosphere containing oxygen, hydrogen ($H_2$), and rare gas, or an atmosphere containing dinitrogen monoxide and a rare gas. On the other hand, a semiconductor film is nitrided by plasma treatment in a nitrogen atmosphere (for example, an atmosphere containing nitrogen ($N_2$) and a rare gas (at least one of He, Ne, Ar, Kr, and Xe), an atmosphere including nitrogen, hydrogen, and a rare gas, or an atmosphere containing $NH_3$ and a rare gas). As a rare gas, for example, Ar can be used. A gas in which Ar and Kr are mixed may be used as well. Accordingly, the insulating films 1521*a* and 1521*b* contain a rare gas (containing at least one of He, Ne, Ar, Kr, and Xe) used for the plasma treatment. When Ar is used, the insulating films 1521*a* and 1521*b* contain Ar.

In addition, the plasma treatment is conducted with an electron density of $1 \times 10^{11}$ to $1 \times 10^{13}$ $cm^{-3}$ or more and an electron temperature of plasma of 0.5 to 1.5 eV in the atmosphere containing the gas described above. The electron density of plasma is high and the electron temperature around an object (here, the semiconductor films 1503*a* and 1503*b*) formed over the substrate 1501 is low. Thus, plasma damages to the object can be avoided. In addition, since the electron density of plasma is $1 \times 10^{11} cm^{-3}$ or higher, the oxide film or the nitride film formed by oxidizing or nitriding the object by the plasma treatment has a superior evenness in film thickness as compared to a film formed by a CVD method, a sputtering method or the like, and thus, can be a dense film. In addition, since the electron temperature of plasma is 1 eV or lower, the oxidation treatment or the nitriding treatment can be conducted at a lower temperature than conventional plasma treatment or a thermal oxidation method. For example, the oxidation treatment or the nitriding treatment can be conducted sufficiently even when the plasma treatment is conducted at a lower temperature by at least 100° C. than a distortion point of a glass substrate. As the frequency for producing plasma, a high frequency wave such as a micro wave (2.45 GHz) can be employed. Hereinafter, the plasma treatment is performed with the aforementioned conditions unless specifically referred.

Next, the gate insulating film 1504 is formed to cover the insulating films 1521*a* and 1521*b* (PIGS. 16C-1 and 16C-2). The gate insulating film 1504 can be formed to have a single layer structure or a multilayer structure of insulating films containing nitrogen or oxygen such as silicon oxide ($SiO_x$), silicon nitride ($SiN_x$), silicon oxynitride ($SiO_xN_y$) (x>y), or silicon nitride oxide ($SiN_xO_y$) (x>y) by a known method (a sputtering method, an LPD method, a plasma CVD method, or the like). For example, when Si is used for the semiconductor films 1503*a* and 1503*b*, and silicon is oxidized by the plasma treatment, silicon oxide is formed as the insulating films 1521*a* and 1521*b* over the surfaces of the semiconductor films 1503*a* and 1503*b*. In this case, silicon oxide ($SiO_x$) is formed as the gate insulating film over the insulating films 1521*a* and 1521*b*. In addition, when the thickness is made thinner, in FIGS. 16B-1 and 16B-2, it is possible that the insulating films 1521*a* and 1521*b* which are formed by oxidizing or nitriding the semiconductor films 1503*a* and 1503*b* by the plasma treatment, are used as the gate insulating films.

Next, by forming the gate electrode 1505 or the like over the gate insulating film 1504, a layer including a semiconductor element can be formed, which has an n-type thin film transistor 1510*a* and a p-type thin film transistor 1510*b* each using the island-shaped semiconductor films 1503*a* and 1503*b* as channel forming regions (FIGS. 16D-1 and 16D-2).

Before forming the gate insulating film 1504 over the semiconductor films 1503*a* and 1503*b*, the surface of each of the semiconductor films 1503*a* and 1503*b* is oxidized or nitrided by the plasma treatment. As a result, a short-circuit or the like between the gate electrode and the semiconductor film due to a coverage defect of the gate insulating film 1504 in the end portions 1551*a*, 1551*b* of the channel forming regions can be prevented. In other words, in the case where the angles of the end portions of the island-shaped semiconductor films are formed almost vertical (θ=85° to 100°), when the gate insulating film is formed to cover the semiconductor films by a CVD method, a sputtering method or the like, there is a risk of a coverage defect due to breakage of the gate insulating film, or the like at the end portions of the semiconductor films. However, when the plasma treatment is conducted to the surface of the semiconductor film to oxide or nitride the surface, coverage defects and the like of the gate insulating film at the end portion of the semiconductor film can be prevented.

Figures 1, 17B:
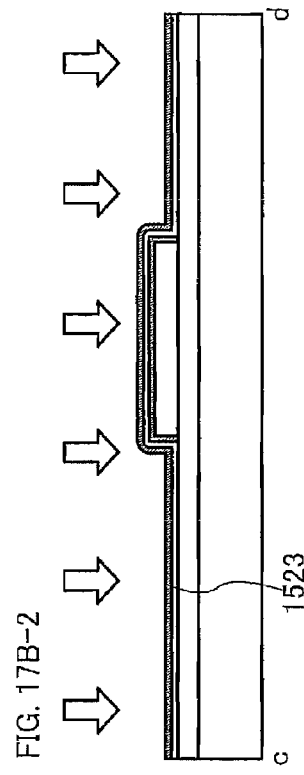
Figures 2, 17B:
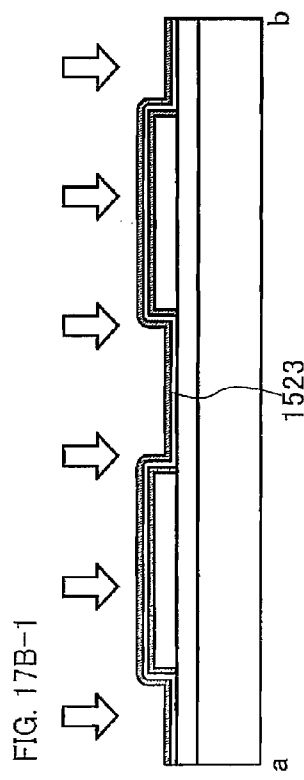

In FIGS. 16A to 16D, the gate insulating film 1504 may be oxidized or nitrided by conducting plasma treatment after forming the gate insulating film 1504. In this case, the gate insulating film 1504 is formed to cover the semiconductor films 1503*a* and 1503*b* (FIGS. 17A-1 and 17A-2), and plasma treatment is conducted to the gate insulating film 1504 to oxidize or nitride the gate insulating film 1504, thereby forming an oxide film or a nitride film 1523 (hereinafter also referred to as an insulating film 1523) over the surface of the gate insulating film 1504 (FIGS. 17B-1 and 17B-2). The conditions for the plasma treatment can be similar to those of FIGS. 16B-1 and 16B-2. In addition, the insulating film 1523 contains a rare gas used in the plasma treatment, for example, in the case of using Ar, Ar is contained in the insulating film 1523.

In FIGS. 17B-1 and 17B-2, after the plasma treatment is conducted in an atmosphere containing oxygen to oxidize the gate insulating film 1504, plasma treatment may be conducted again in an atmosphere containing nitrogen to nitride the gate insulating film 1504. In this case, silicon oxide ($SiO_x$) or silicon oxynitride ($SiO_xN_y$) (x>y) is formed over the semiconductor films 1503*a* and 1503*b*, and silicon nitride oxide ($SiN_xO_y$) (x>y) is formed in contact with the gate electrode 1505. After that, the gate electrode 1505 is formed over the insulating film 1523, and a layer including a semiconductor element can be manufactured, which has the n-type thin film transistor 1510*a* and the p-type thin film transistor 1510*b* each using the island-shaped semiconductor films 1503*a* and 1503*h* as the channel forming regions (FIGS. 17C-1 and 17C-2).

In this manner, by conducting the plasma treatment to the gate insulating film, the surface of the gate insulating film is oxidized or nitrided to be enhanced in its film quality. Thus, a dense film can be obtained. The insulating film obtained by the plasma treatment is denser and has fewer defects such as pinholes as compared to an insulating film formed by a CVD method or a sputtering method, and thus, the characteristics of a thin film transistor can be enhanced.

Figures 1, 17C:
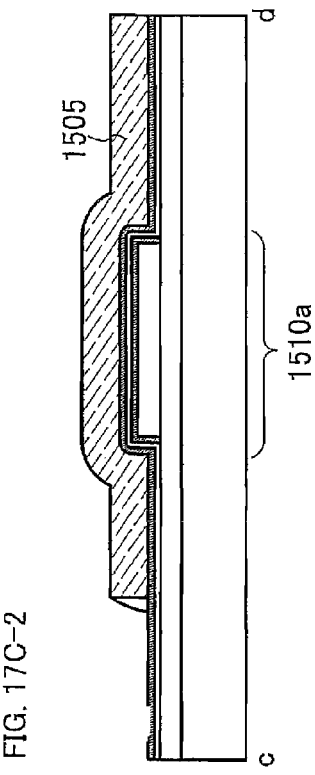
Figures 2, 17C:
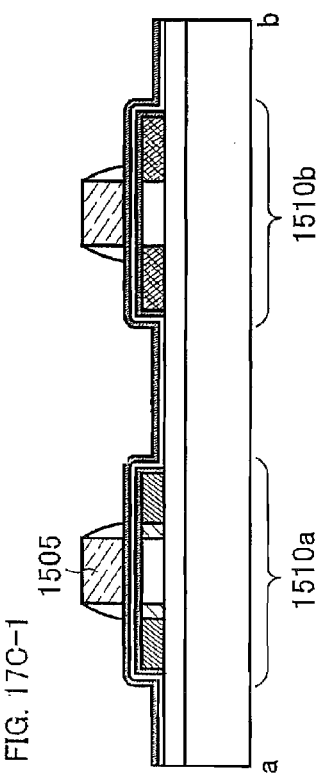

In FIGS. 17A to 17C, the case is described, where the plasma treatment is conducted to the semiconductor films 1503a and 1503b in advance, and the surfaces of the semiconductor films 1503a and 1503b is oxidized or nitrided. However, a method may be employed, in which plasma treatment is conducted after forming the gate insulating film 1504 without conducting the plasma treatment to the semiconductor films 1503a and 1503b. In this manner, by conducting the plasma treatment before forming the gate electrode, even when coverage defects due to breakage of the gate insulating film occurs at the end portions of the semiconductor films, the semiconductor film exposed due to the coverage defects can be oxidized or nitrided, and thus, a short-circuit between the gate electrode and the semiconductor film caused by the coverage defect of the gate insulating film at the end portions of the semiconductor films, or the like can be prevented.

Even when the end portions of the island-shaped semiconductor films are formed almost vertical, the plasma treatment is conducted to the semiconductor films or the gate insulating film to oxidize or nitride the semiconductor films or the gate insulating film, thereby avoiding a short-circuit between the gate electrode and the semiconductor films caused by coverage defects of the gate insulating film at the end portions of the semiconductor films.

Next, the case is described where the end portion of the island-semiconductor film has a tapered shape ($\theta=30°$ to $85°$) in the island-shaped semiconductor film provided over the substrate.

The island-shaped semiconductor films 1503a and 1503b are formed over the substrate 1501 (FIGS. 18A-1 and 18A-2). As to the island-shaped semiconductor films 1503a and 1503b, an amorphous semiconductor film is formed using a material mainly containing silicon (Si) (for example, $Si_xGe_{1-x}$, or the like) over an insulating film 1502 which have been formed over the substrate 1501, by a known method (a sputtering method, an LPCVD method, a plasma CVD method, or the like). Then, the amorphous semiconductor film is crystallized by a known crystallization method such as a laser crystallization method, a thermal crystallization method using RTA or an annealing furnace, a thermal crystallization method using a metal element promoting crystallization. Then, the semiconductor film is selectively etched and removed. In FIGS. 18A to 18D, the end portions of the island-shaped semiconductor films 1503a and 1503b are tapered ($\theta=30°$ to $85°$).

A gate insulating film 1504 is formed to cover the semiconductor films 1503a and 1503b (FIGS. 18B-1 and 18B-2). The gate insulating film 1504 can be formed to have a single layer structure or a multilayer structure of insulating films containing nitrogen or oxygen such as silicon oxide ($SiO_x$), silicon nitride ($SiN_x$), silicon oxynitride ($SiO_xN_y$) ($x>y$), or silicon nitride oxide ($SiN_xO_y$) ($x>y$) by a known method (such as a sputtering method, an LPCVD method, or a plasma CVD method).

Then, the gate insulating film 1504 is oxidized or nitrided by plasma treatment, and thus, an oxide film or a nitride film 1524 (hereinafter also referred to as an insulating film 1524) is formed over the surface of the gate insulating film 1504 (FIGS. 18C-1 and 18C-2). Note that the conditions for the plasma treatment can be similar to those described above. For example, when silicon oxide ($SiO_x$) or silicon oxynitride ($SiO_xN_y$) ($x>y$) is used as the gate insulating film 1504, plasma treatment is conducted in an atmosphere containing oxygen to oxidize the gate insulating film 1504. The film obtained over the surface of the gate insulating film by the plasma treatment is dense and has fewer defects such as pinholes as compared with a gate insulating film formed by a CVD method, a sputtering method or the like. On the other hand, plasma treatment is conducted in an atmosphere containing nitrogen to nitride the gate insulating film 1504, silicon nitride oxide ($SiN_xO_y$) ($x>y$) can be provided as the insulating film 1524 over the surface of the gate insulating film 1504. In addition, after plasma treatment is conducted in an atmosphere containing oxygen to oxidize the gate insulating film 1504, plasma treatment may be conducted again in an atmosphere containing nitrogen to nitride the gate insulating film 1504. In addition, the insulating film 1524 contains a rare gas used in the plasma treatment, for example, in the case of using Ar, Ar is contained in the insulating film 1524.

A layer including a semiconductor element can be manufactured, which has an n-type thin film transistor 1510a and a p-type thin film transistor 1510b each using the semiconductor films 1503a and 1503b as channel forming regions by forming the gate electrode 1505 and the like over the gate insulating film 1504 (FIGS. 18D-1 and 18D-2).

In this manner, by conducting the plasma treatment to the gate insulating film, an insulating film formed of an oxide film or a nitride film is formed over me surface of the gate insulating film, and the surface of the gate insulating film can be enhanced in its film quality. The oxidized or nitrided insulating film by the plasma treatment is denser and has fewer defects such as pinholes as compared to a gate insulating film formed by a CVD method or a sputtering method, and thus, the characteristics of a thin film transistor can be enhanced. Further, it is possible to prevent a short-circuit between the gate electrode and the semiconductor film caused by the coverage defect of the gate insulating film or the like at the end portion of the semiconductor film by forming the end portion of the semiconductor film into a tapered shape. However, by conducting the plasma treatment after forming the gate insulating film, a short-circuit between the gate electrode and the semiconductor film, or the like can further be prevented.

A manufacturing method of a semiconductor device which is different from that in FIGS. 18A to 18D is described with reference to the drawings. Specifically, the case is described where plasma treatment is selectively conducted to an end portion of a semiconductor film having a tapered shape.

The island-shaped semiconductor films 1503a and 1503b are formed over the substrate 1501 (FIGS. 19A-1 and 19A-2). As to the island-shaped semiconductor films 1503a and 1503b, an amorphous semiconductor film is formed using a material mainly containing silicon (Si) (e.g., $Si_xGe_{1-x}$ etc.) over an insulating film 1502 which have been formed over the substrate 1501, by a known method (a sputtering method, an LPCVD method, a plasma CVD method, or the like). Then, the amorphous semiconductor film is crystallized and the semiconductor film is selectively etched using resists 1525a and 1525b as masks. A known crystallization method such as a laser crystallization method, a thermal crystallization method using RTA or an annealing furnace, a thermal crystallization method using a metal element promoting crystallization, a combination of the methods or the like can be adopted to crystallize the amorphous semiconductor film.

Next, before removing the resists 1525a and 1525b used for etching the semiconductor film, plasma treatment is conducted to selectively oxidize or nitride the end portions of the island-shaped semiconductor films 1503a and 1503b. An oxide film or a nitride film 1526 (hereinafter, also referred to as an insulating film 1526) is formed at each end portion of the semiconductor films 1503a and 1503b (FIGS. 19B-1 and 19B-2). The plasma treatment is conducted with the above described conditions. In addition, the insulating film 1526 contains a rare gas used in the plasma treatment.

A gate insulating film 1504 is formed to cover the semiconductor films 1503a and 1503b (FIGS. 19C-1 and 19C-2). The gate insulating film 1504 can be formed similarly as described above.

A layer including a semiconductor element can be manufactured, which has an n-type thin film transistor 1510a and a p-type thin film transistor 1510b each using the island-shaped semiconductor films 1503a and 1503b as channel forming regions by forming the gate electrode 1505 and the like over the gate insulating film 1504 (FIGS. 19D-1 and 19D-2).

When the end portions of the semiconductor films 1503a and 1503b are tapered, the end portions 1552a and 1552b of the channel forming regions formed in a part of the semiconductor films 1503a and 1503b are also tapered. Thus, the thickness of the semiconductor film or the gate insulating film varies as compared to the center portion, and there is a risk that the characteristics of a thin film transistor are affected. Thus, by selectively oxidizing or nitriding the end portions of the channel forming regions by the plasma treatment, an insulating film is formed in the semiconductor film which becomes the end portions of the channel forming region. Thus, the effect on the thin film transistor due to the end portions of the channel forming region can be reduced.

FIGS. 19A to 19D show the example in which the plasma treatment is conducted to only the end portions of the semiconductor films 1503a and 1503b for oxidation or nitridation. Needless to say, the plasma treatment can also be conducted to the gate insulating film 1504 for oxidation or nitridation as shown in FIGS. 18A to 18D (FIGS. 21A-1 and 21A-2).

Next, a manufacturing method of a layer including a semiconductor element is described with reference to the drawings. The method is different from the method described above. Specifically, plasma treatment is applied to a semiconductor film having a tapered shape.

Island-shaped semiconductor films 1503a and 1503b are formed over the substrate 1501 similarly as described above (FIGS. 20A-1 and 20A-2).

Next, plasma treatment is conducted to the semiconductor films 1503a and 1503b to oxidize or nitride the semiconductor films 1503a and 1503b, oxide films or nitride films 1527a and 1527b (hereinafter, also referred to as insulating films 1527a, 1527b)are formed (FIGS. 20B-1 and 20B-2). The plasma treatment can be conducted with the above described conditions. For example, when Si is used for the semiconductor films 1503a and 1503b, silicon oxide ($SiO_x$) or silicon nitride ($SiN_x$) is formed as the insulating films 1527a and 1527b. In addition, after oxidizing the semiconductor films 1503a and 1503b by plasma treatment, plasma treatment may be conducted again to nitride the semiconductor films 1503a and 1503b. In this case, silicon oxide ($SiO_x$) or silicon oxynitride ($SiO_xN_y$) (x>y) is formed in contact with the semiconductor films 1503a and 1503b, and silicon nitride oxide ($SiN_xO_y$) (x>y) is formed over the surface of the silicon oxide. In addition, the insulating films 1527a and 1527b contain a rare gas used for the plasma treatment. By the plasma treatment, the end portions of the semiconductor films 1503a and 1503b are oxidized or nitrided at the same time.

Next, a gate insulating film 1504 is formed to cover the insulating films 1527a and 1527b (FIGS. 20C-1 and 20C-2).

As the gate insulating film 1504, a single layer structure or a stacked-layer structure of insulating films containing nitrogen or oxygen such as silicon oxide ($SiO_x$), silicon nitride ($SiN_x$), silicon oxynitride ($SiO_xN_y$) (x>y), or silicon nitride oxide ($SiN_xO_y$) (x>y) can be employed by a known method (a sputtering method, an LPCVD method, a plasma CVD method, or the like). For example, in the case where the semiconductor films 1503a and 1503b using Si are oxidized by plasma treatment to form silicon oxide as the insulating films 1527a and 1527b over the surface of the semiconductor films 1503a and 1503b, silicon oxide ($SiO_x$) is formed as the gate insulating film 1504 over the insulating film 1527a and 1527b.

Next, a gate electrode 1505 or the like is formed over the gate insulating film 1504, and a layer including a semiconductor element can be manufactured, which has an n-type thin film transistor 1510a and a p-type thin film transistor 1510h each using the island-shaped semiconductor films 1503a and 1503b as channel forming regions by forming the gate electrode 1505 and the like over the gate insulating film 1504 (FIGS. 20D-1 and 20D-2).

When the end portions of the semiconductor films 1503a and 1503b are tapered, the end portions 1553a and 1553b of the channel forming regions formed in a portion of the semiconductor films 1503a and 1503b are also tapered. Thus, there is a risk that the characteristics of a semiconductor element are affected. By oxidizing or nitriding the end portions of the channel forming regions as a result of oxidizing or nitriding the semiconductor films by the plasma treatment, the effect on a semiconductor element can be reduced.

In FIGS. 20A to 20D, the example is shown in which only the semiconductor films 1503a and 1503b are subjected to oxidization or nitridation by plasma treatment; however, the plasma treatment can be conducted to the gate insulating film 1504 for oxidation or nitridation as shown in FIGS. 18A to 18D (FIGS. 21B-1 and 21B-2). In this case, after the plasma treatment is conducted in an atmosphere containing oxygen to oxide the gate insulating film 1504, plasma treatment may be conducted again in an atmosphere containing nitrogen to nitride the gate insulating film 1504. In this case, silicon oxide ($SiO_x$) or silicon oxynitride ($SiO_xN_y$) (x>y) is formed in the semiconductor films 1503a and 1503b, and silicon nitride oxide ($SiN_xO_y$) (x>y) is formed in contact with the gate electrode 1505.

Figure 22A:
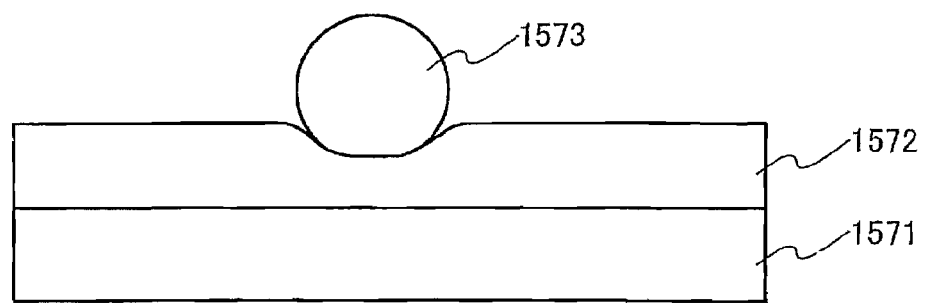
FIGS. 22A and 22B are sectional views showing manufacturing steps of semiconductor elements which form a wireless chip.
Figure 22B:
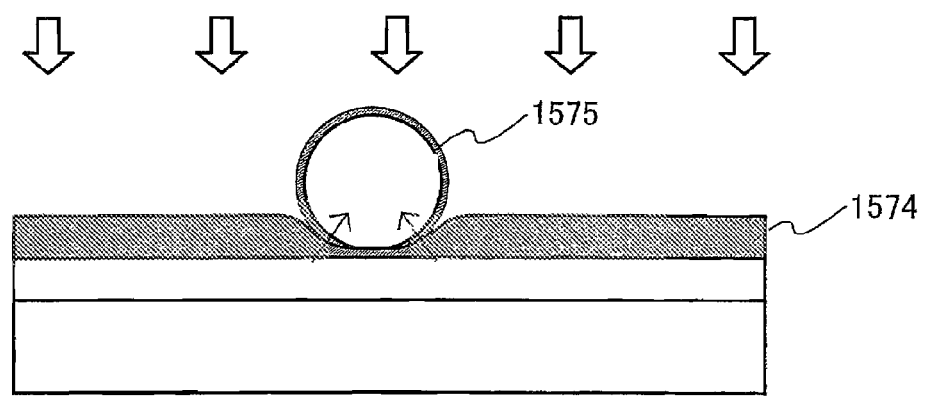

By conducting the plasma treatment in this manner, impurities such as dusts attached to the semiconductor film or the insulating film can be easily removed. In general, in some cases, dusts (also referred to as particles) are attached to the film formed by a CVD method, a sputtering method or the like. For example, as shown in FIG. 22A, a dust 1573 is formed over an insulating film 1572 formed by a CVD method, a sputtering method, or the like, which is formed over a film 1571 such as an insulating film, a conductive film, or a semiconductor film, or the like. In such a case, the insulating film 1572 is oxidized or nitrided by the plasma treatment and an oxide film or a nitride film 1574 (hereinafter, also referred to as an insulating film 1574) is formed over the surface of the insulating film 1572. As to the insulating film 1574, a portion under the dust 1573 as well as a portion in which the dust 1573 does not exist are oxidized or nitrided, and thus the volume of the insulating film 1574 is increased. The surface of the dust 1573 is also oxidized or nitrided by the plasma treatment to form an insulating film 1575, and as a result, the volume of the dust 1573 is also increased (FIG. 22B).

At this time, the dust 1573 can be easily removed from the surface of the insulating film 1574 by simple cleaning such as brush cleaning. In this manner, by the plasma treatment, even a minute dust attached to the insulating film or a semiconductor film can be removed easily. It is noted that this is an effect obtained by conducting the plasma treatment, and this is true to other embodiment modes as well as this embodiment mode.

As described above, by improving the film quality of the surface of the semiconductor film or the gate insulating film by oxidation or nitridation by the plasma treatment, a dense insulating film having good film quality can be formed. In addition, dusts etc., attached to the surface of the insulating film can be removed easily by cleaning. Consequently, even when the insulating film is formed thinner, defects such as pinholes can be avoided, and miniaturization and higher performance of a semiconductor element such as a thin film transistor can be realized It is to be noted that this embodiment can be freely implemented in combination with the aforementioned embodiment modes.

This application is based on Japanese Patent Application serial no. 2005-129326 filed on Apr. 27, 2005, in Japan Patent Office, the entire contents of which are hereby incorporated by reference.

What is claimed is:

1. A semiconductor device comprising:
an antenna, the antenna comprising:
a first conductive layer;
a second conductive layer; and
a third conductive layer;
an arithmetic processing circuit portion; and
a memory portion,
wherein the first conductive layer comprises a first region, a second region and a third region between the first region and the second region,
wherein the first conductive layer is bent so that a surface of the first region is parallel to a normal direction of the third region, and a surface of the second region is parallel to the normal direction of the third region,
wherein at least a part of the second conductive layer is aligned with the first region of the first conductive layer,
wherein at least a part of the third conductive layer is aligned with the second region of the first conductive layer, and
wherein the arithmetic processing circuit portion and the memory portion are surrounded by the first conductive layer, the second conductive layer and the third conductive layer.

2. The semiconductor device according to claim 1, wherein at least one of the first conductive layer, the second conductive layer and the third conductive layer comprises at least one selected from the group consisting of gold, silver, copper, palladium, platinum and aluminum.

3. The semiconductor device according to claim 1 further comprises an insulator surrounded by the first region, the second region and the third region.

4. The semiconductor device according to claim 3, wherein the arithmetic processing circuit portion, and the memory portion are surrounded by the insulator.

5. The semiconductor device according to claim 1, wherein the semiconductor device is configured to communicate with a reader/writer wirelessly.

6. The semiconductor device according to claim 1 further comprising a power source circuit portion, wherein the power source circuit portion is surrounded by the first conductive layer, the second conductive layer and the third conductive layer.

7. A semiconductor device comprising:
an antenna, the antenna comprising:
a first conductive layer;
a second conductive layer; and
a third conductive layer; and
a semiconductor element, the semiconductor element comprising:
a semiconductor substrate;
a source region and a drain region in the semiconductor substrate;
a gate insulating film over the semiconductor substrate; and
a gate electrode over the gate insulating film,
wherein the first conductive layer has a first region, a second region and a third region between the first region and the second region,
wherein the first conductive layer is bent so that a surface of the first region is parallel to a normal direction of the third region, and a surface of the second region is parallel to the normal direction of the third region,
wherein at least a part of the second conductive layer is aligned with the first region of the first conductive layer,
wherein at least a part of the third conductive layer is aligned with the second region of the first conductive layer, and
wherein at least a part of the semiconductor element is surrounded by the first conductive layer, the second conductive layer and the third conductive layer.

8. The semiconductor device according to claim 7, wherein at least one of the first conductive layer, the second conductive layer and the third conductive layer comprises at least one selected from the group consisting of gold, silver, copper, palladium, platinum and aluminum.

9. The semiconductor device according to claim 7 further comprises an insulator surrounded by the first region, the second region and the third region.

10. The semiconductor device according to claim 9, wherein the semiconductor element is surrounded by the insulator.

11. The semiconductor device according to claim 7, wherein the semiconductor device is configured to communicate with a reader/writer wirelessly.

12. A semiconductor device comprising:
an antenna, the antenna comprising:
a first conductive layer;
a second conductive layer; and
a third conductive layer; and
a semiconductor element, the semiconductor element comprising a semiconductor layer, a gate electrode, and a gate insulating film between the semiconductor layer and the gate electrode over a substrate
wherein the first conductive layer has a first region, a second region and a third region between the first region and the second region,
wherein the first conductive layer is bent so that a surface of the first region is parallel to a normal direction of the third region, and a surface of the second region is parallel to the normal direction of the third region,
wherein at least a part of the second conductive layer is aligned with the first region of the first conductive layer,
wherein at least a part of the third conductive layer is aligned with the second region of the first conductive layer, and wherein at least a part of the semiconductor element is surrounded by the first conductive layer, the second conductive layer and the third conductive layer.

13. The semiconductor device according to claim 12, wherein at least one of the first conductive layer, the second conductive layer and the third conductive layer comprises at least one selected from the group consisting of gold, silver, copper, palladium, platinum and aluminum.

14. The semiconductor device according to claim 12 further comprises an insulator surrounded by the first region, the second region and the third region.

15. The semiconductor device according to claim 14, wherein the semiconductor element is surrounded by the insulator.

16. The semiconductor device according to claim 12, wherein the semiconductor device is configured to communicate with a reader/writer wirelessly.

17. The semiconductor device according to claim 12, wherein the semiconductor layer comprises a crystalline structure.

* * * * *

UNITED STATES PATENT AND TRADEMARK OFFICE
CERTIFICATE OF CORRECTION

PATENT NO. : 8,310,399 B2
APPLICATION NO. : 13/371675
DATED : November 13, 2012
INVENTOR(S) : Shunpei Yamazaki et al.

It is certified that error appears in the above-identified patent and that said Letters Patent is hereby corrected as shown below:

In the Specifications:

At column 10, line 61, "phenyl-ammo" should be --phenyl-amino--;

At column 11, line 9, "alurninum" should be --aluminum--;

At column 11, line 25, "friazole" should be --triazole--;

At column 16, line 17, "suicide" should be --silicide--;

At column 16, line 25, "ME" should be --RIE--;

At column 18, line 62, "hi h" should be --high--;

At column 29, line 62, "PIGS." should be --FIGS.--;

At column 30, line 66, "1503h" should be --1503b--;

At column 32, line 29, "me" should be --the--;

At column 34, line 17, "1510h" should be --1510b--.

Signed and Sealed this
Fourth Day of June, 2013

Teresa Stanek Rea
*Acting Director of the United States Patent and Trademark Office*